US012588251B2

(12) United States Patent
Kim et al.

(10) Patent No.: US 12,588,251 B2
(45) Date of Patent: Mar. 24, 2026

(54) SEMICONDUCTOR MEMORY DEVICE

(71) Applicant: SAMSUNG ELECTRONICS CO., LTD., Suwon-si (KR)

(72) Inventors: Hyuncheol Kim, Seoul (KR); Yongseok Kim, Suwon-si (KR); Dongsoo Woo, Seoul (KR); Kyunghwan Lee, Seoul (KR); Minjun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 782 days.

(21) Appl. No.: 17/875,781

(22) Filed: Jul. 28, 2022

(65) Prior Publication Data

US 2023/0140318 A1 May 4, 2023

(30) Foreign Application Priority Data

Nov. 1, 2021 (KR) ........................ 10-2021-0147869

(51) Int. Cl.
| | |
|---|---|
| *H10D 30/69* | (2025.01) |
| *G11C 11/22* | (2006.01) |
| *G11C 11/56* | (2006.01) |
| *H10B 51/20* | (2023.01) |
| *H10D 12/00* | (2025.01) |

(Continued)

(52) U.S. Cl.
CPC ........... *H10D 30/693* (2025.01); *G11C 11/22* (2013.01); *G11C 11/223* (2013.01); *G11C 11/5657* (2013.01); *H10B 51/20* (2023.02); *H10D 12/021* (2025.01); *H10D 12/211* (2025.01); *H10D 30/6735* (2025.01); *H10D 30/6757* (2025.01); *H10D 30/694* (2025.01); *H10D 30/701* (2025.01); *H10D 64/033* (2025.01);

(Continued)

(58) Field of Classification Search
CPC ........ H10B 51/20; H10B 51/00; H10B 51/30; H10B 43/20; H10B 43/27; H10D 30/701; H10D 64/689
See application file for complete search history.

(56) References Cited

U.S. PATENT DOCUMENTS

| | | | |
|---|---|---|---|
| 9,685,215 | B1 | 6/2017 | Kang et al. |
| 9,818,468 | B2 | 11/2017 | Müller |

(Continued)

FOREIGN PATENT DOCUMENTS

| | | |
|---|---|---|
| KR | 10-2266538 B1 | 6/2021 |

OTHER PUBLICATIONS

Sugiyama, Hideki et al., "An improvement in C-V characteristics of metal-ferroelectric-insulator-semiconductor structure for ferroelectric gate FET memory using a silicon nitride buffer layer," Japanese Journal of Applied Physics 39.4S (2000): 2131.

*Primary Examiner* — Jose R Diaz
(74) *Attorney, Agent, or Firm* — Muir Patent Law, PLLC

(57) ABSTRACT

A semiconductor memory device may include a substrate, first and second impurity regions on the substrate, first and second gate insulating layers sequentially stacked on the substrate and extended in a direction between the first and second impurity regions, and a gate electrode on the second gate insulating layer. The first and second impurity regions may have different conductivity types from each other, a bottom surface of the first gate insulating layer may be in direct contact with a top surface of the substrate, and the second gate insulating layer may include a ferroelectric material.

9 Claims, 22 Drawing Sheets

(51) Int. Cl.

| | | |
|---|---|---|
| *H10D 12/01* | (2025.01) | |
| *H10D 30/67* | (2025.01) | |
| *H10D 64/01* | (2025.01) | |
| *H10D 64/27* | (2025.01) | |
| *H10D 64/68* | (2025.01) | |

(52) U.S. Cl.
CPC ......... *H10D 64/685* (2025.01); *H10D 64/689* (2025.01); *H10D 64/311* (2025.01)

(56)     References Cited

U.S. PATENT DOCUMENTS

| | | | |
|---|---|---|---|
| 2010/0140589 A1 | 6/2010 | Ionescu | |
| 2015/0070964 A1 | 3/2015 | Yamada et al. | |
| 2016/0308021 A1 | 10/2016 | Lee | |
| 2020/0203499 A1 | 6/2020 | Chang et al. | |
| 2020/0235243 A1 | 7/2020 | Avci et al. | |
| 2021/0175254 A1 | 6/2021 | Van Houdt | |
| 2022/0352193 A1* | 11/2022 | Said | H10B 41/27 |
| 2022/0406796 A1* | 12/2022 | Seki | H10D 64/033 |

* cited by examiner

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2021-0147869, filed on Nov. 1, 2021, in the Korean Intellectual Property Office, the entire contents of which are hereby incorporated by reference.

BACKGROUND

1. Field

Embodiments relate to a semiconductor memory device.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Embodiments are directed to a semiconductor memory device, including a substrate, first and second impurity regions on the substrate, first and second gate insulating layers sequentially stacked on the substrate and extended in a direction between the first and second impurity regions, and a gate electrode on the second gate insulating layer. The first and second impurity regions may have different conductivity types from each other, a bottom surface of the first gate insulating layer may be in direct contact with a top surface of the substrate, and the second gate insulating layer may include a ferroelectric material.

Embodiments are directed to a semiconductor memory device including a substrate, a stack structure including interlayer dielectric layers and gate electrodes, which are alternately and repeatedly stacked on the substrate, and vertical channel structures, which are provided in vertical channel holes penetrating the stack structure and are in contact with the substrate. Each of the vertical channel structures may include a ferroelectric pattern covering an inner side surface of each of the vertical channel holes, a vertical semiconductor pattern, which covers the ferroelectric pattern and is connected to the substrate, a charge trap pattern interposed between the ferroelectric pattern and the vertical semiconductor pattern, and a conductive pad provided on the vertical semiconductor pattern. The substrate and the conductive pad may have different conductivity types from each other. The ferroelectric pattern and the charge trap pattern may be vertically extended between the substrate and the conductive pad, and an inner side surface of the charge trap pattern may be in direct contact with an outer side surface of the vertical semiconductor pattern.

Embodiments are directed to a semiconductor memory device including bit lines arranged in a first direction and extended in a second direction crossing the first direction, vertical semiconductor patterns on the bit lines, a gate structure extended in the first direction to cross the bit lines, the gate structure penetrating the vertical semiconductor patterns, and source lines, which are arranged in the first direction, are provided on the vertical semiconductor patterns, and are extended in the second direction to cross the gate structure. The gate structure may include a gate electrode, a charge trap pattern surrounding the gate electrode, and a ferroelectric pattern interposed between the gate electrode and the charge trap pattern. Each of the vertical semiconductor patterns may include a first impurity region adjacent to each of the bit lines, a second impurity region adjacent to each of the source lines, and a channel region provided between the first and second impurity regions to enclose the gate structure. The first and second impurity regions may have different conductivity types from each other, and the charge trap pattern may be in direct contact with the channel region of each of the vertical semiconductor patterns.

Embodiments are directed to a semiconductor memory device including a substrate, a stack structure including interlayer dielectric layers and word lines, which are alternately and repeatedly stacked on the substrate, the word lines extending in a first direction parallel to a top surface of the substrate, semiconductor patterns crossing the word lines and extending in a second direction crossing the first direction, a ferroelectric pattern and a charge trap pattern interposed between each pair of the word lines and the semiconductor patterns, bit lines, which are extended in a third direction perpendicular to the top surface of the substrate and are spaced apart from each other in the first direction, and each of which is in contact with first side surfaces of the semiconductor patterns spaced apart from each other in the third direction, and a source line, which is in contact with second side surfaces of the semiconductor patterns opposite to the first side surfaces. Each of the semiconductor patterns may include a first impurity region adjacent to each of the bit lines, a second impurity region adjacent to the source line, and a channel region between the first and second impurity regions. The first and second impurity regions may have different conductivity types from each other, and the charge trap pattern may be in direct contact with the channel region of each of the semiconductor patterns.

BRIEF DESCRIPTION OF THE DRAWINGS

Features will become apparent to those of skill in the art by describing in detail example embodiments with reference to the attached drawings in which:

FIG. 9B is a sectional view, which is taken along lines A-A' and B-B' of FIG. 9A to illustrate a semiconductor memory device according to an example embodiment.

FIG. 11B is a sectional view, which is taken along lines A-A' and B-B' of FIG. 11A to illustrate a semiconductor memory device according to an example embodiment.

DETAILED DESCRIPTION

Figure 1:
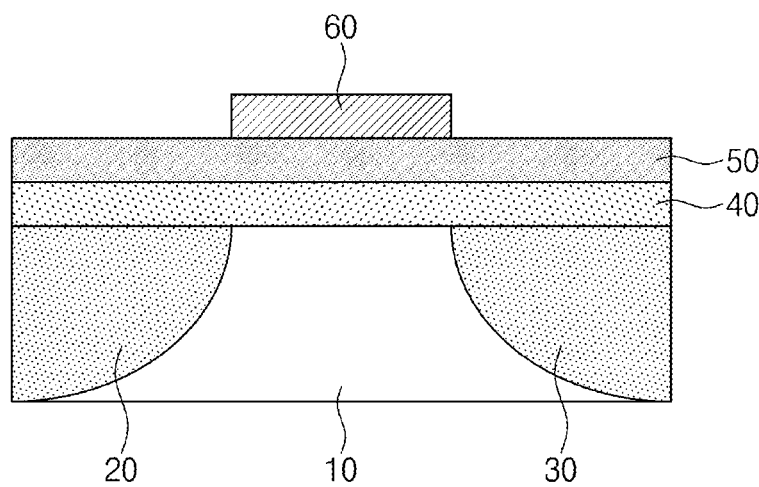
FIG. 1 is a sectional view illustrating a semiconductor memory device according to an example embodiment.

FIG. 1 is a sectional view illustrating a semiconductor memory device according to an example embodiment.

Referring to FIG. 1, the semiconductor memory device may include a substrate 10, a first impurity region 20 and a second impurity region 30 in an upper portion of the substrate 10, a first gate insulating layer 40 and a second gate insulating layer 50 on the substrate 10, and a gate electrode 60 on the second gate insulating layer 50.

The substrate 10 may be a semiconductor substrate containing a semiconductor material. For example, the substrate 10 may be a silicon wafer, a silicon germanium wafer, or a germanium wafer. An upper portion of the substrate 10, which is located between the first and second impurity regions 20 and 30, may be referred to as a channel region. The first and second impurity regions 20 and 30 may be connected to the channel region in the substrate 10.

Each of the first and second impurity regions 20 and 30 may be used as a source or drain region of the semiconductor memory device. As an example, the first impurity region 20 may be the source region of the semiconductor memory device, the second impurity region 30 may be the drain region of the semiconductor memory device.

The first and second impurity regions 20 and 30 may be impurity regions that are formed by doping portions of the substrate 10 with impurities, or the first and second impurity regions 20 and 30 may be formed by depositing an impurity-doped semiconductor material.

The first and second impurity regions 20 and 30 may have different conductivity types from each other. More specifically, the first impurity region 20 may have a first conductivity type (e.g., n-type), and the second impurity region 30 may have a second conductivity type (e.g., p-type) different from the first conductivity type of the first impurity region 20.

The first gate insulating layer 40 may be provided on a top surface of the substrate 10. A bottom surface of the first gate insulating layer 40 may be in direct contact with the top surface of the substrate 10. The first gate insulating layer 40 may be provided between the substrate 10 and the second gate insulating layer 50. The first gate insulating layer 40 may be formed of or include at least one of, e.g., silicon nitride or zirconium silicate. The first gate insulating layer 40 may be used as a charge trap layer of the semiconductor memory device.

The second gate insulating layer 50 may be provided on a top surface of the first gate insulating layer 40. A bottom surface of the second gate insulating layer 50 may be in direct contact with the top surface of the first gate insulating layer 40. The second gate insulating layer 50 may be provided between the first gate insulating layer 40 and the gate electrode 60. The second gate insulating layer 50 may be formed of or include a material different from the first gate insulating layer 40. The second gate insulating layer 50 may include a ferroelectric material. The second gate insulating layer 50 may be formed of or include at least one of hafnium compounds ($HfSiO_x$, $HfO_2$, HfZnO, and so forth).

Figure 2A:
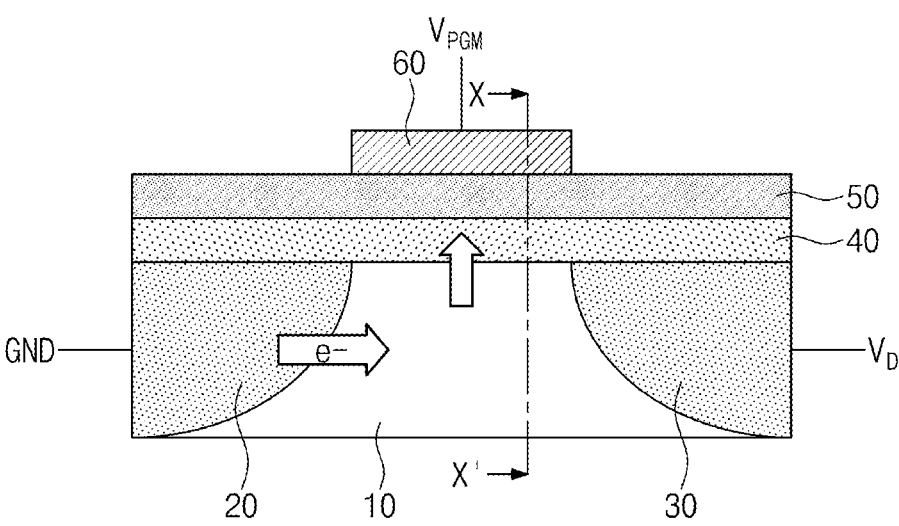
FIGS. 2A and 3A are sectional views illustrating a method of operating a semiconductor memory device according to an example embodiment.
Figure 2B:
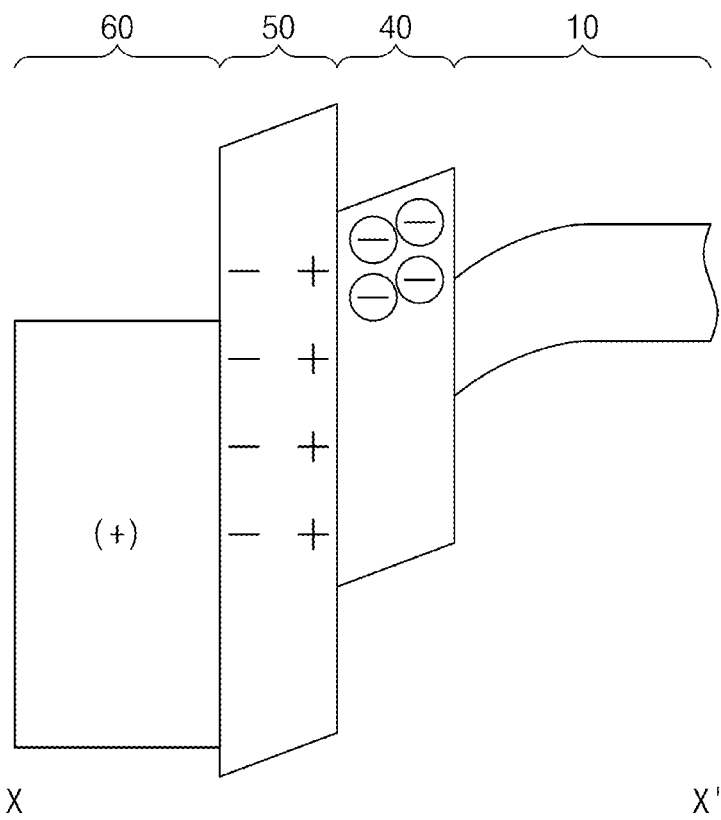
FIGS. 2B, 2C, 3B, and 3C are band diagrams illustrating a method of operating a semiconductor memory device according to an example embodiment.
Figure 2C:
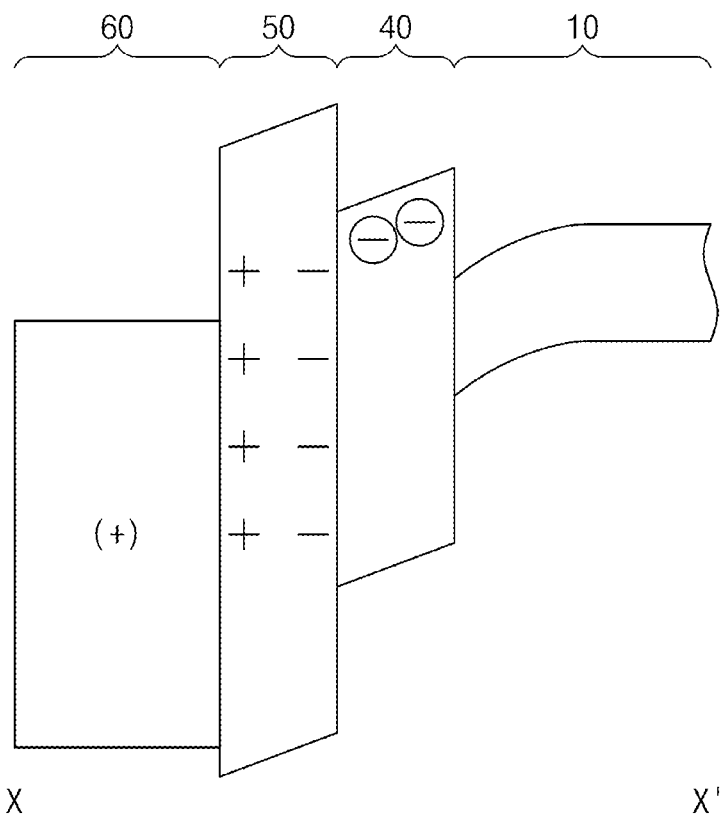

FIG. 2A is a sectional view illustrating a method of operating a semiconductor memory device according to an example embodiment. FIGS. 2B and 2C are band diagrams illustrating a method of operating a semiconductor memory device, according to an example embodiment.

Referring to FIG. 2A, a program voltage $V_{PGM}$ may be applied to the gate electrode 60. Here, the first impurity region 20 may be grounded to a ground node (GND), and a voltage $V_D$ may be applied to the second impurity region 30. The program voltage $V_{PGM}$ may be a positive voltage. In the case where the program voltage $V_{PGM}$ is applied to the gate electrode 60, electrons ($e^-$) may be supplied to an upper portion of the substrate 10 from the first impurity region 20. In this case, as a result of a tunneling phenomenon, some of the electrons ($e^-$) may be stored into the first gate insulating layer 40.

Referring to FIGS. 2B and 2C, an amount of electrons ($e^-$) stored in the first gate insulating layer 40 may be determined depending on a polarization direction of the second gate insulating layer 50. This may allow the semiconductor memory device to have two or more data states, which are determined depending on the polarization direction of the second gate insulating layer 50.

Figure 3A:
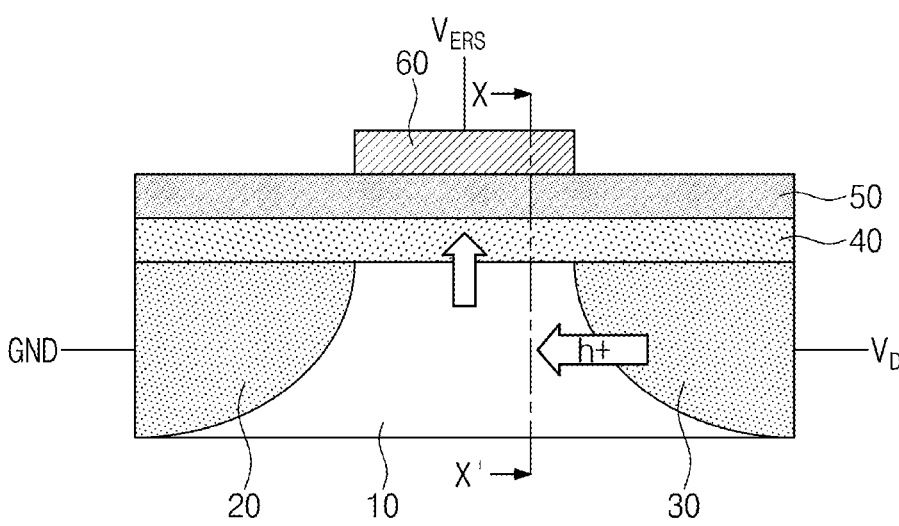
Figure 3B:
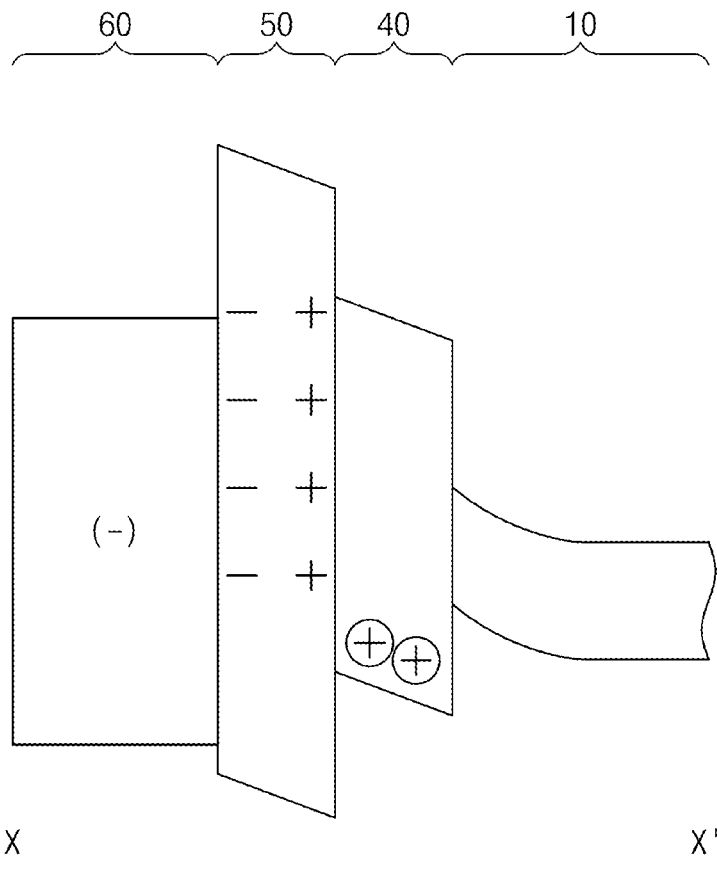
Figure 3C:
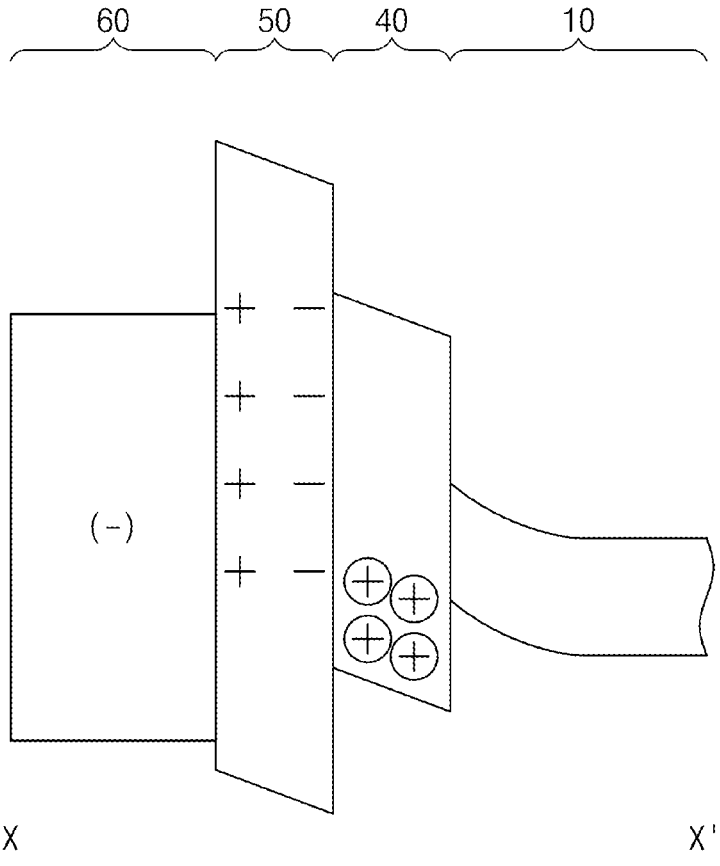

FIG. 3A is a sectional view illustrating a method of operating a semiconductor memory device according to an example embodiment. FIGS. 3B and 3C are band diagrams illustrating a method of operating a semiconductor memory device, according to an example embodiment.

Referring to FIG. 3A, an erase voltage $V_{ERS}$ may be applied to the gate electrode 60. At this time, the first impurity region 20 may be grounded to a ground node (GND), and the voltage $V_D$ may be applied to the second impurity region 30. The erase voltage $V_{ERS}$ may be a negative voltage. In the case where the erase voltage $V_{ERS}$ is applied to the gate electrode 60, holes ($h^+$) may be supplied to the upper portion of the substrate 10 from the second impurity region 30. In this case, as a result of a tunneling phenomenon, some of the holes ($h^+$) may be stored in the first gate insulating layer 40.

Referring to FIGS. 3B and 3C, an amount of holes ($h^+$) stored in the first gate insulating layer 40 may be determined depending on a polarization direction of the second gate insulating layer 50. That is, the semiconductor memory device according to an example embodiment may have two or more data states which are determined depending on a polarization direction of the second gate insulating layer 50 and a sign of the voltage applied to the gate electrode 60. Since the holes ($h^+$) are supplied from the second impurity region 30, the erase operation in the semiconductor memory device may be more quickly performed.

Figure 4:
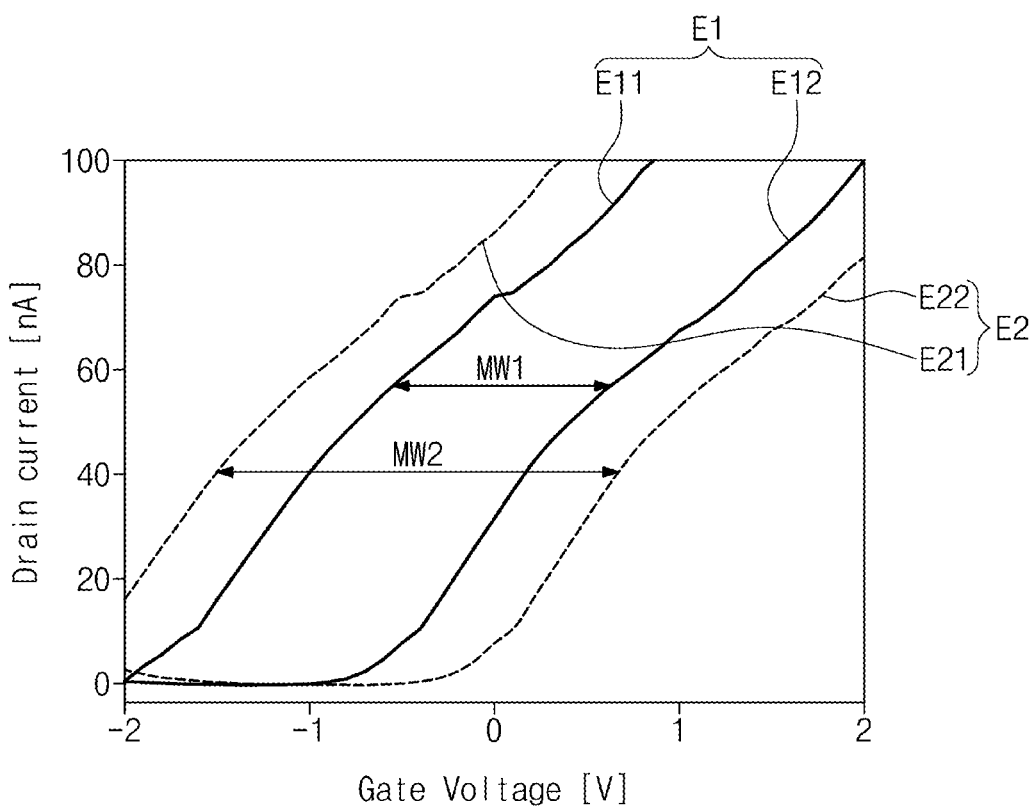
FIG. 4 is a graph illustrating characteristics of a semiconductor memory device according to an example embodiment.

FIG. 4 is a graph illustrating characteristics of a semiconductor memory device according to an example embodiment.

More specifically, FIG. 4 shows a drain current versus a gate voltage obtained in a first experiment example E1 and a second experiment example E2. A first curve E11 and a second curve E12, which are measured in the first experiment example E1, and a third curve E21 and a fourth curve E22, which are measured in the second experiment example E2, represents different data states. A first memory window MW1 means the largest value between gate voltages of the first and second curves E11 and E12 in the first experiment example E1, and a second memory window MW2 means the largest value between gate voltages of the third and fourth curves E21 and E22 in the second experiment example E2. A unit of the gate voltage is volt (V), and a unit of the drain current is nano ampere (nA).

Referring back to FIG. 1, the first experiment example E1 corresponds to the case in which only the first gate insulating layer 40 is provided between the substrate 10 and the gate electrode 60, and the second experiment example E2 corresponds to the case in which the first and second gate insulating layers 40 and 50 are provided between the substrate 10 and the gate electrode 60, as described with reference to FIG. 1.

From the comparison of the first experiment example E1 with the second experiment example E2, it can be seen that the second memory window MW2 obtained when the first and second gate insulating layers 40 and 50 are provided between the substrate 10 and the gate electrode 60, is larger than the first memory window MW1 obtained when only the first gate insulating layer 40 is provided between the substrate 10 and the gate electrode 60. In other words, the structure in which the first and second gate insulating layers 40 and 50 are provided between the substrate 10 and the gate electrode 60 is advantageous in realizing a multi-state memory device, compared with the structure in which only the first gate insulating layer 40 is provided between the substrate 10 and the gate electrode 60.

Figure 5A:
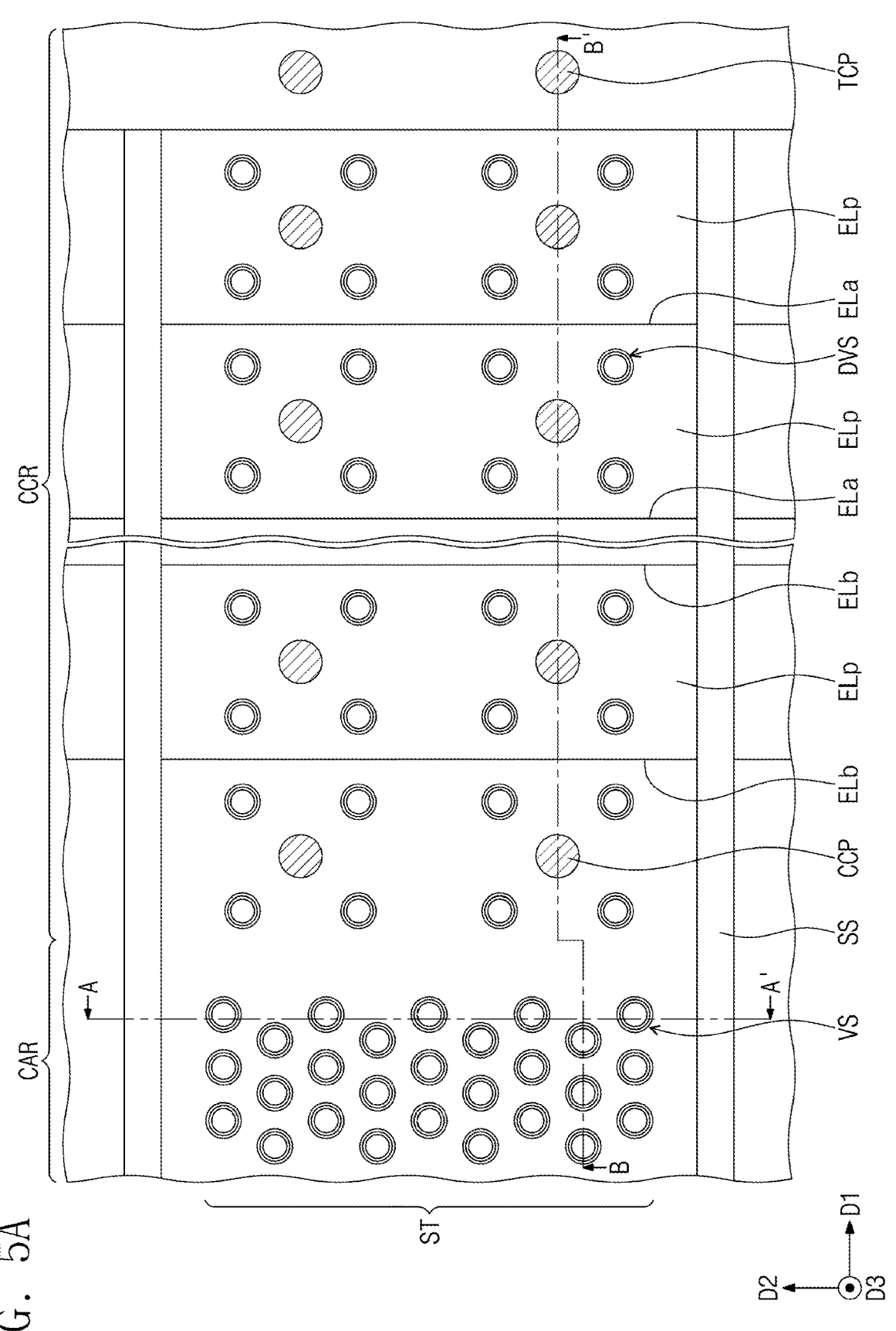
FIGS. 5A and 7A are plan views illustrating a semiconductor memory device according to an example embodiment.
Figure 5B:
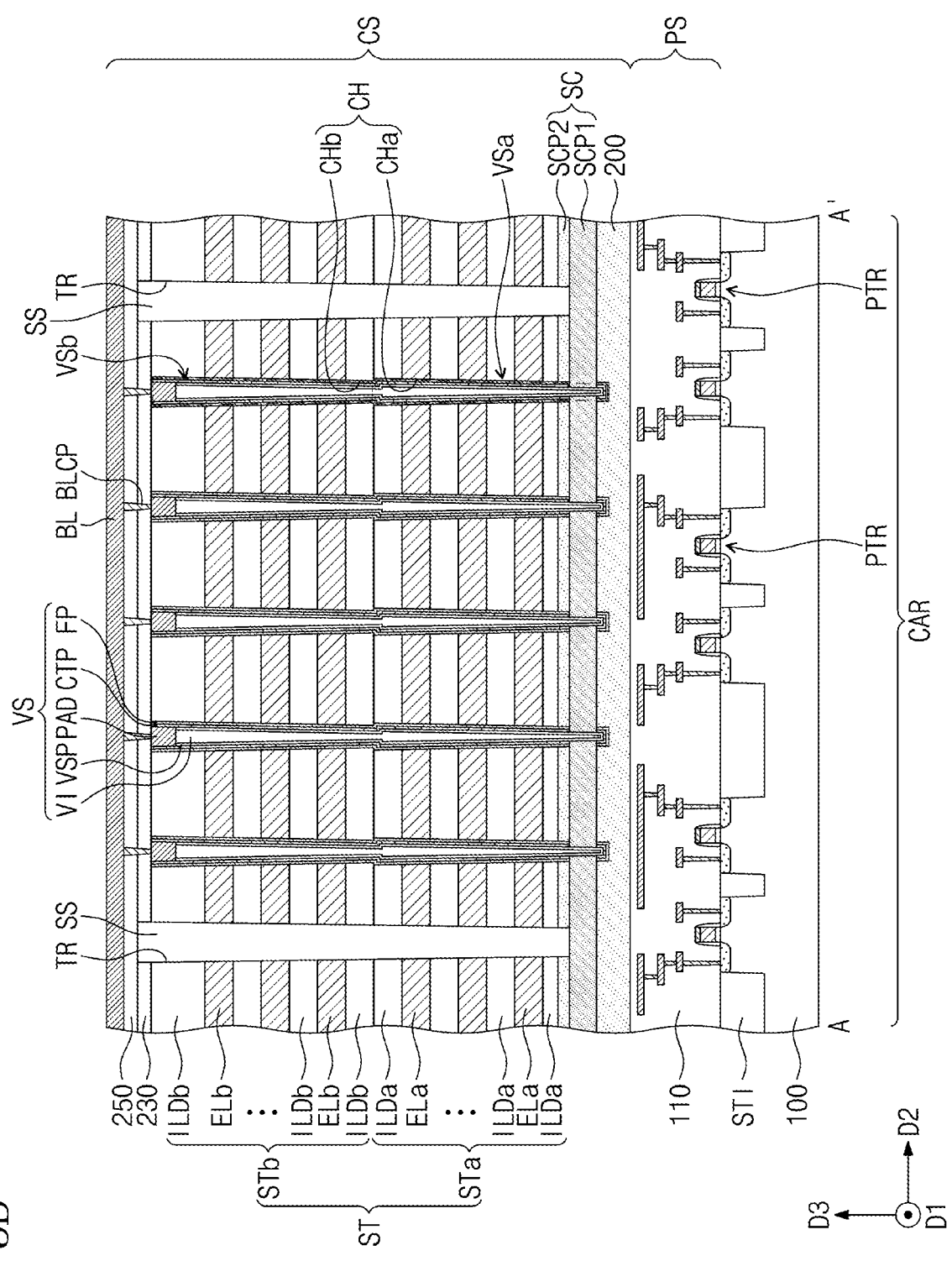
FIGS. 5B, 5C, and 7B are sectional views, each of which is taken alone a line A-A' or B-B' of FIG. 5A or 7A to illustrate a semiconductor memory device according to an example embodiment.
Figure 5C:
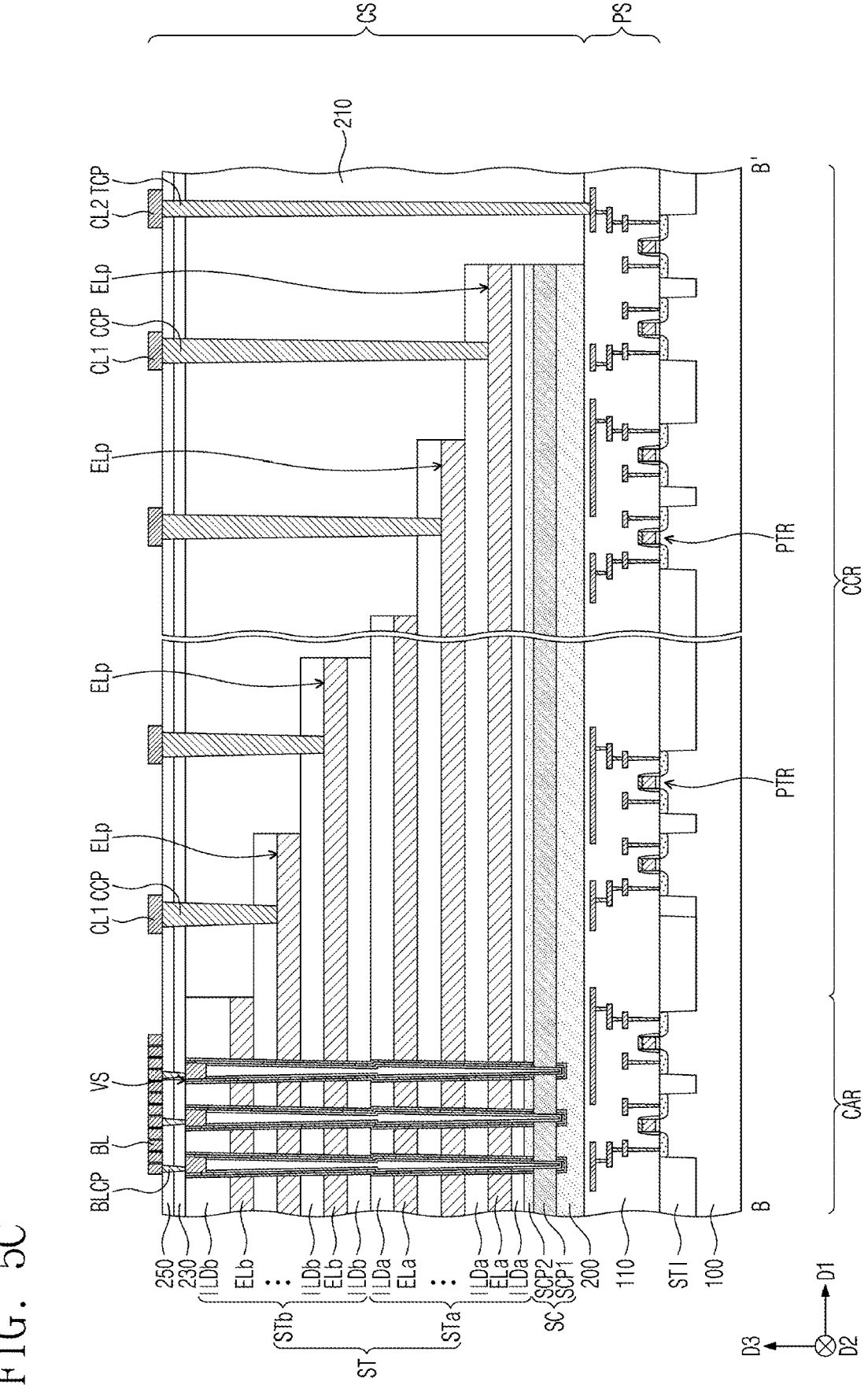

FIG. 5A is a plan view illustrating a semiconductor memory device according to an example embodiment. FIGS. 5B and 5C are sectional views, which are respectively taken alone lines A-A' and B-B' of FIG. 5A to illustrate a semiconductor memory device according to an example embodiment.

Referring to FIGS. 5A, 5B, and 5C, a first substrate 100 including a cell array region CAR and a contact region CCR may be provided. The first substrate 100 may be extended not only in a first direction D1 from the cell array region CAR toward the contact region CCR but also in a second direction D2 crossing the first direction D1. A top surface of the first substrate 100 may be perpendicular to a third direction D3, which is not parallel to the first and second directions D1 and D2. In an example embodiment, the first, second, and third directions D1, D2, and D3 may be orthogonal to each other.

The contact region CCR may be extended from the cell array region CAR in the first direction D1. Vertical channel structures VS, separation structures SS, and bit lines BL may be provided on the cell array region CAR, as will be described below. Pad portions ELp and a staircase structure constructed thereby may be provided on the contact region CCR, as will be described below.

The first substrate 100 may be a semiconductor substrate containing a semiconductor material. For example, the first substrate 100 may be a silicon wafer, a silicon germanium wafer, or a germanium wafer. A device isolation layer STI may be provided in the first substrate 100. The device isolation layer STI may define an active region of the first substrate 100. The device isolation layer STI may be formed of or include, e.g., silicon oxide.

A peripheral circuit structure PS may be provided on the first substrate 100. The peripheral circuit structure PS may include peripheral circuit transistors PTR on the active region of the first substrate 100, peripheral circuit contact plugs, peripheral circuit interconnection lines electrically connected to the peripheral circuit transistors PTR via the peripheral circuit contact plugs, and a first insulating layer 110 enclosing them.

The peripheral circuit transistors PTR, the peripheral circuit contact plugs, and the peripheral circuit interconnection lines may constitute a peripheral circuit. For example, the peripheral circuit transistors PTR may constitute a decoder circuit, a page buffer, a logic circuit, and so forth. More specifically, each of the peripheral circuit transistors PTR may include a peripheral gate insulating layer, a peripheral gate electrode, a peripheral capping pattern, a peripheral gate spacer, and peripheral source/drain regions.

The peripheral circuit interconnection lines may be electrically connected to the peripheral circuit transistors PTR through the peripheral circuit contact plugs. In an example embodiment, each of the peripheral circuit transistors PTR may be an NMOS transistor, a PMOS transistor, or a gate-all-around type transistor. The peripheral circuit contact plugs and the peripheral circuit interconnection lines may be formed of or include at least one of conductive materials (e.g., metallic materials).

The first insulating layer 110 may be provided on the top surface of the first substrate 100. The first insulating layer 110 may be provided on the first substrate 100 to cover the peripheral circuit transistors PTR, the peripheral circuit contact plugs, and the peripheral circuit interconnection lines. The first insulating layer 110 may have a multi-layered structure including a plurality of insulating layers. For example, the first insulating layer 110 may be formed of or include at least one of silicon oxide, silicon nitride, silicon oxynitride, and/or low-k dielectric materials.

A cell array structure CS may be provided on the peripheral circuit structure PS, and in an example embodiment, the cell array structure CS may include a second substrate 200, a stack structure ST, the separation structures SS, and the vertical channel structures VS. Hereinafter, the cell array structure CS will be described in more detail.

The second substrate 200 may be provided on the cell array region CAR and the contact region CCR to cover the first insulating layer 110. The second substrate 200 may be extended in the first and second directions D1 and D2. The second substrate 200 may be a semiconductor substrate containing a semiconductor material. The second substrate 200 may be formed of or include at least one of silicon (Si), germanium (Ge), silicon germanium (SiGe), gallium arsenic (GaAs), indium gallium arsenic (InGaAs), or aluminum gallium arsenic (AlGaAs).

The stack structure ST may be provided on the second substrate 200. The stack structure ST may be extended from the cell array region CAR toward the contact region CCR in the first direction D1.

The stack structure ST may include a plurality of stack structures ST. The stack structures ST may be arranged in the second direction D2. When viewed in the plan view of FIG. 5A, the separation structures SS may be provided in trenches TR, which are formed between the stack structures ST and are extended in the first direction D1. The separation structures SS may be extended from the cell array region CAR to the contact region CCR. The stack structures ST may be spaced apart from each other in the second direction D2 with one of the separation structures SS interposed therebetween. Hereinafter, just one of the stack structures ST will be described below, for brevity's sake, but the others may also have substantially the same features as those described below.

The separation structures SS may be composed of a single insulating layer or may include a plurality of insulating layers. The separation structures SS may be formed of or include at least one of silicon oxide, silicon nitride, silicon oxynitride, and/or low-k dielectric materials.

When viewed in the sectional views of FIGS. 5B and 5C, the stack structure ST may include interlayer dielectric layers ILDa and ILDb and gate electrodes ELa and ELb, which are alternately and repeatedly stacked in the third direction D3. More specifically, the stack structure ST may include a lower stack structure STa on the second substrate 200 and an upper stack structure STb on the lower stack structure STa. The lower stack structure STa may include first interlayer dielectric layers ILDa and first gate electrodes ELa, which are alternately and repeatedly stacked. The upper stack structure STb may include second interlayer dielectric layers ILDb and second gate electrodes ELb, which are alternately and repeatedly stacked.

As a height from the second substrate 200 (i.e., in the third direction D3) increases, a length of each of the first and second gate electrodes ELa and ELb in the first direction D1 may decrease. That is, the length of each of the first and second gate electrodes ELa and ELb in the first direction D1 may be larger than a length of another electrode thereon in the first direction D1. The lowermost one of the first gate electrodes ELa of the lower stack structure STa may have the longest length in the first direction D1, and the uppermost one of the second gate electrodes ELb of the upper stack structure STb may have the shortest length in the first direction D1.

Referring to FIGS. 5A and 5C, the first and second gate electrodes ELa and ELb may have the pad portions ELp on the contact region CCR. The pad portions ELp of the first and second gate electrodes ELa and ELb may be disposed at positions that are different from each other in horizontal and vertical directions. The pad portions ELp may form the staircase structure in the first direction D1.

Due to the staircase structure, as a distance from the vertical channel structures VS increases, a thickness of each of the upper and lower stack structures STa and STb may decrease, and when viewed in a plan view, side surfaces of the first and second gate electrodes ELa and ELb may be spaced apart from each other by substantially the same distance in the first direction D1.

The first and second gate electrodes ELa and ELb may be formed of or include at least one of, e.g., doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

The first and second interlayer dielectric layers ILDa and ILDb may be provided between the first and second gate electrodes ELa and ELb. Similar to the first and second gate electrodes ELa and ELb, as a distance from the second substrate 200 increases, lengths of the first and second interlayer dielectric layers ILDa and ILDb in the first direction D1 may decrease.

The lowermost one of the second interlayer dielectric layers ILDb may be in contact with the uppermost one of the first interlayer dielectric layers ILDa. In an example embodiment, a thickness of each of the first and second interlayer dielectric layers ILDa and ILDb may be smaller than a thickness of each of the first and second gate electrodes ELa and ELb. In the present specification, a thickness of an element may mean a length of the element measured in the third direction D3. A thickness of the lowermost one of the first interlayer dielectric layers ILDa may be smaller than those of the remaining ones of the interlayer dielectric layers ILDa and ILDb. A thickness of the uppermost one of the second interlayer dielectric layers ILDb may be larger than those of the remaining ones of the interlayer dielectric layers ILDa and ILDb. However, the thicknesses of the first and second interlayer dielectric layers ILDa and ILDb may be variously changed, depending on technical properties intended for each semiconductor device.

The first and second interlayer dielectric layers ILDa and ILDb may be formed of or include at least one of silicon oxide, silicon nitride, silicon oxynitride, and/or low-k dielectric materials. For example, the first and second interlayer dielectric layers ILDa and ILDb may be formed of or include high density plasma (HDP) oxide or tetraethyl orthosilicate (TEOS).

A source structure SC may be provided between the second substrate 200 and the stack structure ST. The second substrate 200 and the source structure SC may correspond to a common source line. The source structure SC may be extended parallel to the first and second gate electrodes ELa and ELb of the stack structure ST or in the first and second directions D1 and D2. The source structure SC may include a first source conductive pattern SCP1 and a second source conductive pattern SCP2, which are sequentially stacked. The second source conductive pattern SCP2 may be provided between the first source conductive pattern SCP1 and the lowermost one of the first interlayer dielectric layers ILDa. Each of the first and second source conductive patterns SCP1 and SCP2 may include a doped semiconductor material. In an example embodiment, an impurity concentration of the first source conductive pattern SCP1 may be higher than an impurity concentration of the second source conductive pattern SCP2. Each of the first and second source conductive patterns SCP1 and SCP2 may have a first conductivity type (e.g., n-type).

The vertical channel structures VS may be provided on the cell array region CAR to penetrate the stack structure ST and the source structure SC and to be in contact with the second substrate 200. The vertical channel structures VS may be provided to penetrate at least a portion of the second substrate 200, and a bottom surface of each of the vertical channel structures VS may be located at a level lower than a top surface of the second substrate 200 and a bottom surface of the source structure SC.

The vertical channel structures VS may be arranged to form a zigzag shape in the first or second direction D1 or D2, when viewed in a plan view. In an example embodiment, the vertical channel structures VS may not be provided on the contact region CCR.

The vertical channel structures VS may be provided in vertical channel holes CH, which are formed to penetrate the stack structure ST. Each of the vertical channel structures VS may include a lower vertical channel structure VSa, which is provided in a corresponding one of lower vertical channel holes CHa penetrating the lower stack structure STa, and an upper vertical channel structure VSb, which is provided in a corresponding one of upper vertical channel holes CHb penetrating the upper stack structure STb. The lower vertical channel structure VSa may be connected to the upper vertical channel structure VSb in the third direction D3.

As a distance in the third direction D3 increases, a width of each of the upper and lower vertical channel structures VSa and VSb may increase. In an example embodiment, the uppermost width of the lower vertical channel structure VSa may be larger than the lowermost width of the upper vertical channel structure VSb. In other words, a side surface of each of the vertical channel structures VS may have a stepwise shape near a boundary between the lower and upper vertical channel structures VSa and VSb. However, the side surface of each of the vertical channel structures VS may have three or more stepwise portions located at different levels or may be a flat shape without a stepwise portion, unlike that illustrated in the drawings.

Each of the vertical channel structures VS may include a ferroelectric pattern FP, which is provided adjacent to the stack structure ST (i.e., to cover an inner side surface of each of the vertical channel holes CH), a charge trap pattern CTP, which is provided to conformally cover an inner side surface of the ferroelectric pattern FP, a vertical semiconductor pattern VSP, which is provided to conformally cover an inner side surface of the charge trap pattern CTP, a gapfill insulating pattern VI, which is provided to fill an internal space of the vertical semiconductor pattern VSP, and a conductive pad PAD, which is provided on the gapfill insulating pattern VI and is surrounded by the charge trap pattern CTP. In an example embodiment, a top surface of each of the vertical channel structures VS may have a circular, elliptical, or bar shape.

The vertical semiconductor pattern VSP may be provided between the charge trap pattern CTP and the gapfill insulating pattern VI. The vertical semiconductor pattern VSP may be provided between the conductive pad PAD and the second substrate 200, when viewed in a vertical direction. The vertical semiconductor pattern VSP may be shaped like a bottom-closed pipe or macaroni. In an example embodiment, the vertical semiconductor pattern VSP may be in contact with the first source conductive pattern SCP1 of the source structure SC. The vertical semiconductor pattern VSP may be formed of or include, e.g., polysilicon.

The ferroelectric pattern FP and the charge trap pattern CTP may be shaped like a bottom-opened pipe or macaroni. The charge trap pattern CTP may be provided between the ferroelectric pattern FP and the vertical semiconductor pattern VSP. An inner side surface of the charge trap pattern CTP may be in direct contact with an outer side surface of the vertical semiconductor pattern VSP.

The ferroelectric pattern FP may include a ferroelectric material. For example, the ferroelectric pattern FP may be formed of or include at least one of hafnium compounds (HfSiO$_x$, HfO$_2$, HfZnO, and so forth). The charge trap pattern CTP may be formed of or include at least one of, e.g., silicon nitride or zirconium silicate. Since the ferroelectric pattern FP and the charge trap pattern CTP are provided between the first and second gate electrodes ELa and ELb and the vertical semiconductor pattern VSP, a semiconductor memory device according to an example embodiment may have not only a non-volatile memory property but also three or more data states.

The gapfill insulating pattern VI may be formed of or include, e.g., silicon oxide. The conductive pad PAD may be formed of or include a doped semiconductor material. The conductive pad PAD may have a second conductivity type (e.g., p-type) that is different from the first conductivity type of the first and second source conductive patterns SCP1 and SCP2. Since the conductive pad PAD and the source structure SC have different conductivity types from each other, it may be possible to reduce time required for an erase operation in the semiconductor memory device.

A plurality of dummy vertical channel structures DVS may be provided on the contact region CCR to penetrate a second insulating layer 210 to be described below, the stack structure ST, and the source structure SC. More specifically, the dummy vertical channel structures DVS may be provided to penetrate the pad portions ELp of the first and second gate electrodes ELa and ELb. The dummy vertical channel structures DVS may be provided near cell contact plugs CCP to be described below. The dummy vertical channel structures DVS may not be provided on the cell array region CAR. The dummy vertical channel structures DVS and the vertical channel structures VS may be formed at the same time and may have substantially the same structure. However, in an example embodiment, the dummy vertical channel structures DVS may not be provided.

The second insulating layer 210 may be provided on the contact region CCR to cover the staircase structure of the stack structure ST. The second insulating layer 210 may have a substantially flat top surface. The top surface of the second insulating layer 210 may be substantially coplanar with the uppermost surface of the stack structure ST (i.e., the top surface of the uppermost one of the second interlayer dielectric layers ILDb).

A third insulating layer 230 and a fourth insulating layer 250 may be sequentially stacked on the stack structure ST and the second insulating layer 210. Each of the second to fourth insulating layers 210, 230, and 250 may be formed of or include at least one of insulating materials (e.g., silicon oxide, silicon nitride, silicon oxynitride, and/or low-k dielectric materials).

Referring to FIG. 5B, the separation structures SS may be provided to penetrate the third insulating layer 230 and the stack structure ST. In an example embodiment, the separation structures SS may further penetrate at least a portion (i.e., the second source conductive pattern SCP2) of the source structure SC. The separation structures SS may further penetrate the second insulating layer 210 on the contact region CCR. Each of the separation structures SS may be spaced apart from the vertical channel structures VS in the second direction D2. In an example embodiment, a top surface of each of the separation structures SS may be substantially coplanar with a top surface of the third insulating layer 230. A bottom surface of each of the separation structures SS may be in contact with a top surface of the first source conductive pattern SCP1.

The cell contact plugs CCP may be provided on the contact region CCR to penetrate the second to fourth insulating layers 210, 230, and 250. Each of the cell contact plugs CCP may further penetrate one of the interlayer dielectric layers ILDa and ILDb of the stack structure ST and may be in contact with and electrically connected to one of the gate electrodes ELa and ELb. The cell contact plugs CCP may be provided on the pad portions ELp. The cell contact plugs CCP may be spaced apart from the dummy vertical channel structures DVS. As a distance from the vertical channel structures VS increases, a height of each of the cell contact plugs CCP in the third direction D3 may increase.

A penetration contact plug TCP may be provided on the contact region CCR to penetrate the second to fourth insulating layers 210, 230, and 250, and may be electrically connected to a corresponding one of the peripheral circuit transistors PTR of the peripheral circuit structure PS. The penetration contact plug TCP may further penetrate at least a portion of the first insulating layer 110, and may be in contact with one of the peripheral circuit interconnection lines of the peripheral circuit structure PS. The penetration contact plug TCP may be spaced apart from the second substrate 200 and the source structure SC in the first direction D1. In an example embodiment, a plurality of penetration contact plugs TCP may be provided. In an example embodiment, one of the penetration contact plugs TCP may penetrate the second to fourth insulating layers 210, 230, and 250, and may be in contact with the top surface of the second substrate 200.

As a distance in the third direction D3 increases, a width of each of the cell contact plugs CCP and the penetration contact plug TCP may increase. The cell contact plugs CCP and the penetration contact plug TCP may be formed of or include at least one of conductive materials (e.g., metallic materials).

Bit lines BL, first conductive lines CL1, and a second conductive line CL2 may be provided on the fourth insulating layer 250, and may be electrically connected to the vertical channel structures VS, the cell contact plugs CCP, and the penetration contact plug TCP, respectively. Each of the vertical channel structures VS may be connected to a corresponding one of the bit lines BL through a bit line contact plug BLCP. Each of the vertical channel structures VS may be overlapped with a pair of the bit lines BL in the third direction D3 and may be electrically connected to one of them. The bit lines BL, the bit line contact plug BLCP, and the first and second conductive lines CL1 and CL2 may be formed of or include at least one of conductive materials (e.g., metallic materials).

An additional insulating layer may be provided on the fourth insulating layer 250 to cover the bit lines BL and the first and second conductive lines CL1 and CL2, and in an embodiment, additional interconnection lines may be provided in or on the additional insulating layer.

Figure 6:
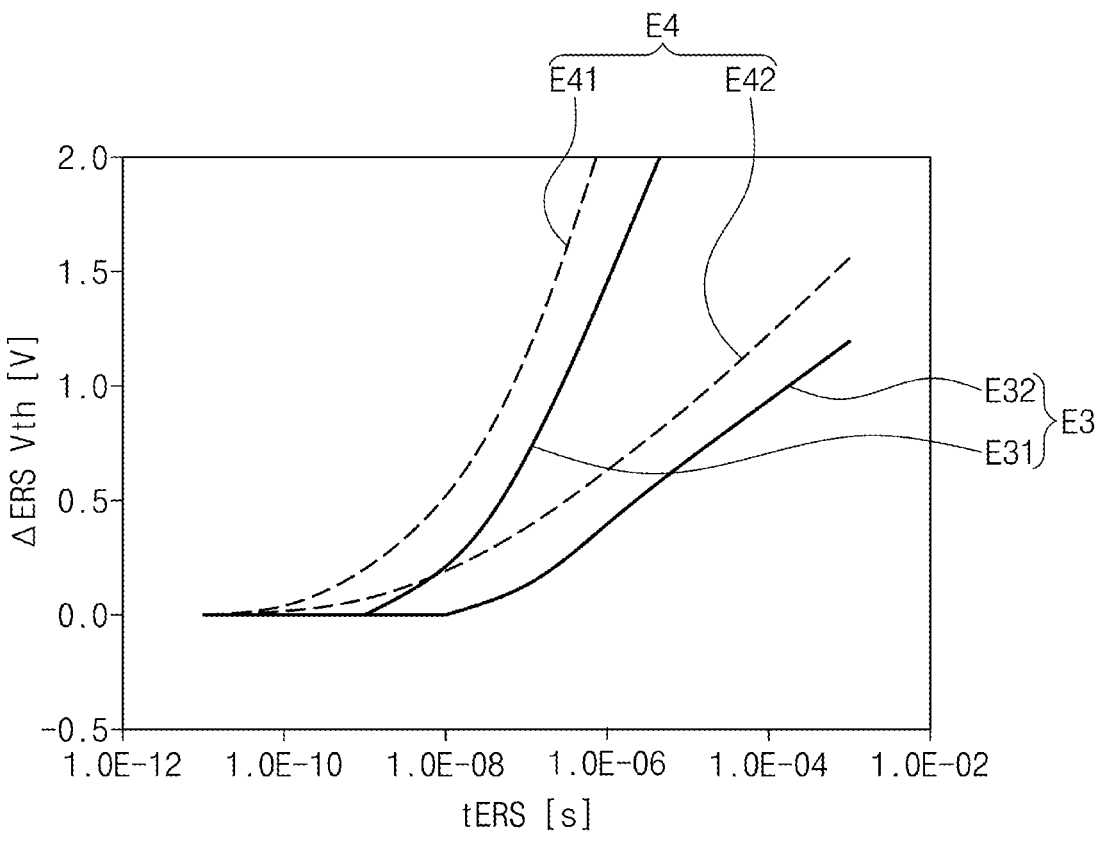
FIG. 6 is a graph illustrating characteristics of a semiconductor memory device according to an example embodiment.

FIG. 6 is a graph illustrating characteristics of a semiconductor memory device according to an example embodiment.

More specifically, FIG. 6 shows a threshold voltage ($\Delta$ERS $V_{th}$) of an erase operation versus an erase time tERS, measured in a third experiment example E3 and a fourth experiment example E4. First and third curves E31 and E41 in the third and fourth experiment examples E3 and E4 were measured using a gate voltage of about 7V, and second and fourth curves E32 and E42 in the third and fourth experiment examples E3 and E4 were measured using a gate voltage of about 5V. A unit of the erase time tERS is second (s), and a unit of the threshold voltage ($\Delta$ERS $V_{th}$) is volt (V).

Referring back to FIG. 1, the third experiment example E3 corresponds to the case in which the first and second impurity regions 20 and 30 have the same conductivity type (e.g., n-type), and the fourth experiment example E4 corresponds to the case in which the first and second impurity regions 20 and 30 have different conductivity types, like the embodiment described with reference to FIG. 1.

Comparing the first and third curves E31 and E41 in the third and fourth experiment examples E3 and E4, it can be seen that an operation time, which is required for the erase operation at the same threshold voltage, was shorter in the fourth experiment example E4, in which the first and second impurity regions 20 and 30 have different conductivity types, than in the third experiment example E3, in which the first and second impurity regions 20 and 30 have the same conductivity type.

Comparing the second and fourth curves E32 and E42 in the third and fourth experiment examples E3 and E4, it can be seen that an operation time, which is required for the erase operation at the same threshold voltage, was shorter in the fourth experiment example E4, in which the first and second impurity regions 20 and 30 have different conductivity types, than in the third experiment example E3, in which the first and second impurity regions 20 and 30 have the same conductivity type.

More specifically, when the gate voltage is about 5V and the threshold voltage is about 1V, the operation time for the erase operation is about ten times shorter in the fourth experiment example E4, in which the first and second impurity regions 20 and 30 have different conductivity types, than in the third experiment example E3, in which the first and second impurity regions 20 and 30 have the same conductivity type.

Figure 7A:
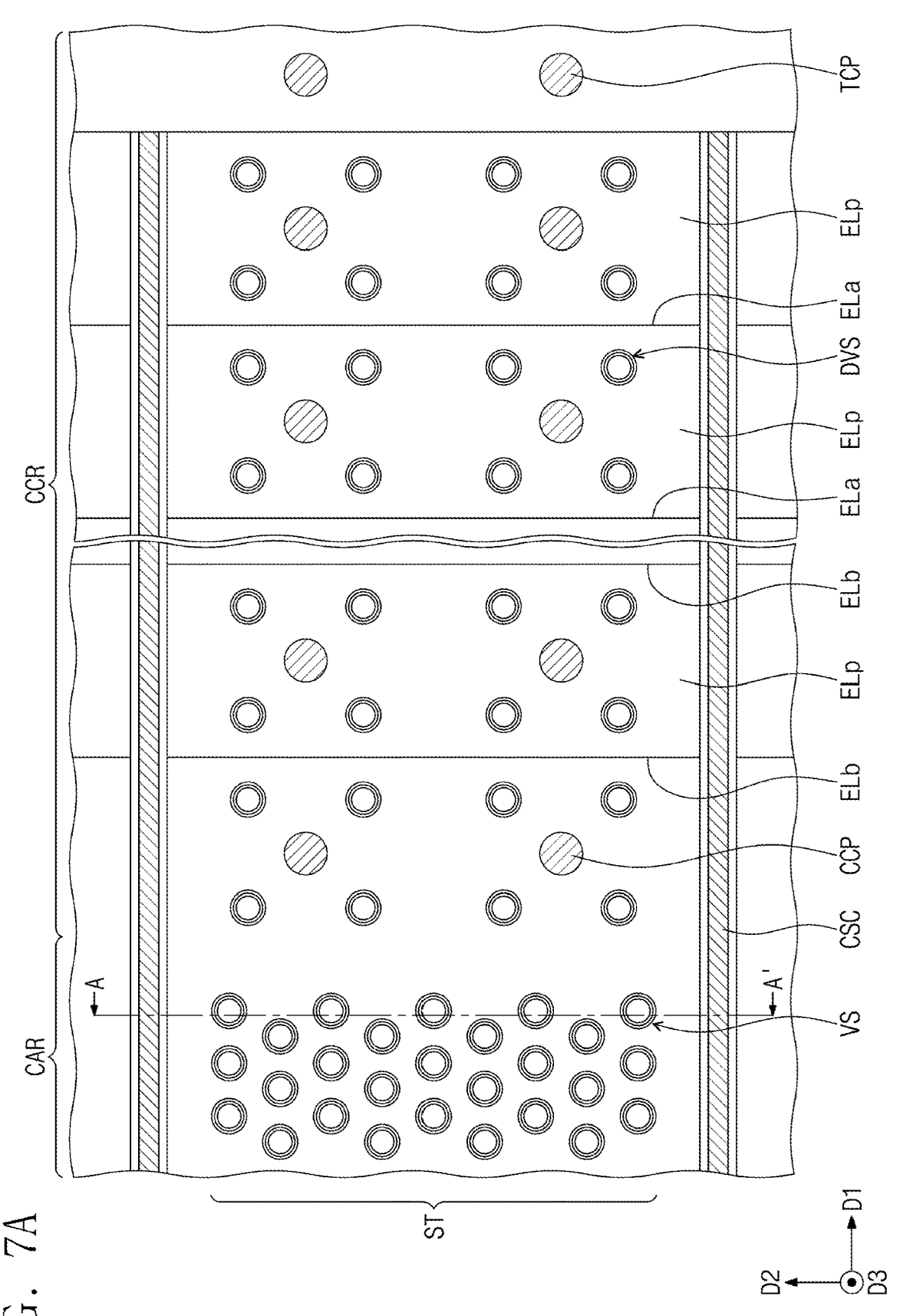
Figure 7B:
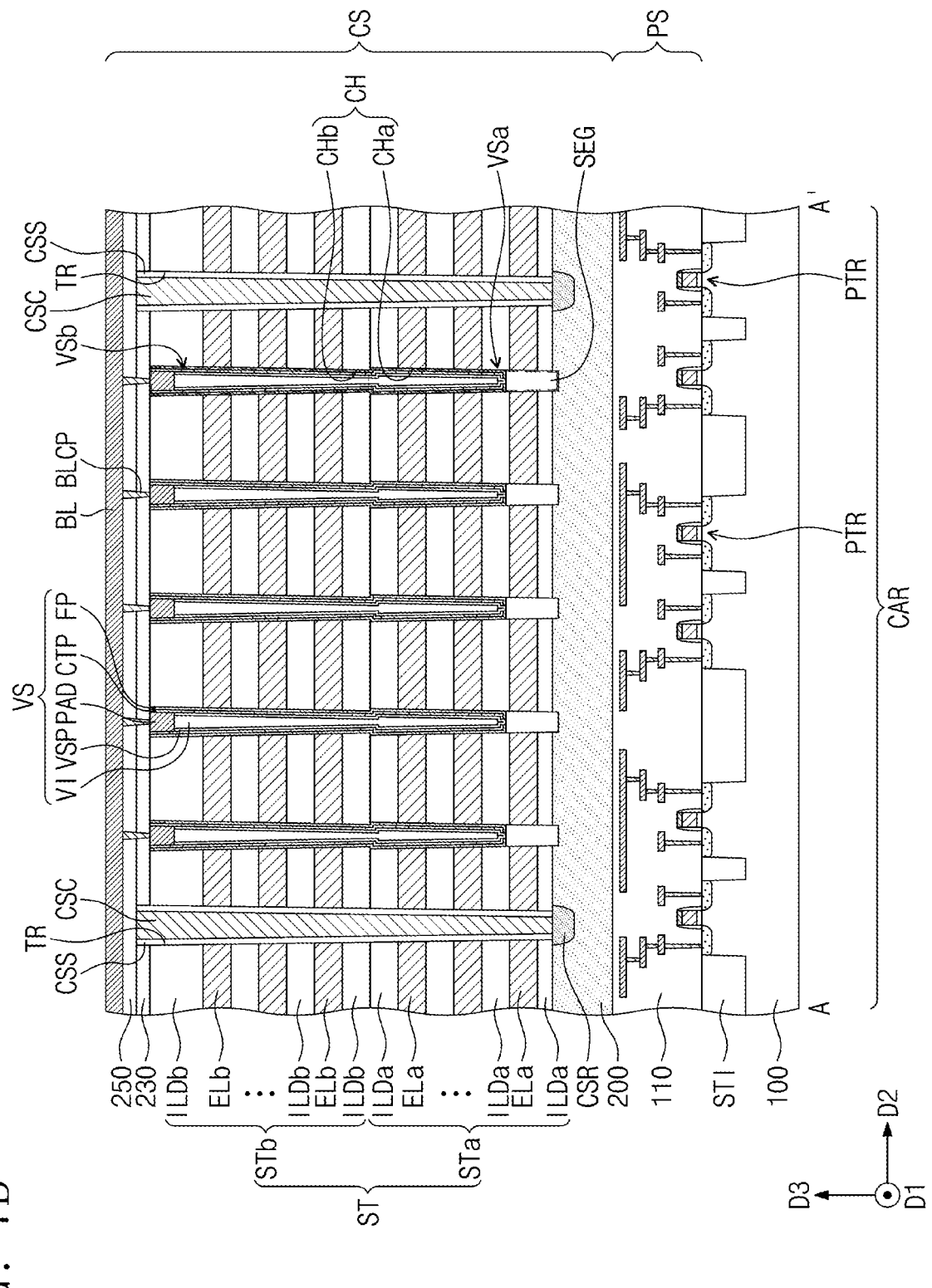

FIG. 7A is a plan view illustrating a semiconductor memory device according to an example embodiment. FIG. 7B is a sectional view, which is taken alone a line A-A' of FIG. or 7A to illustrate a semiconductor memory device according to an example embodiment. In the following description, an element previously described with reference to FIGS. 5A, 5B, and 5C may be identified by the same reference number without repeating an overlapping description thereof, for concise description.

Referring to FIGS. 7A and 7B, the second substrate 200 may be in contact with the lowermost one of the first interlayer dielectric layers ILDa of the lower stack structure STa. The second substrate 200 may have, e.g., the first conductivity type (e.g., n-type). In an example embodiment, a common source region CSR of the first conductivity type may be provided in the second substrate 200. The common source region CSR may be in contact with a common source contact CSC, and may be extended in the first direction D1.

Each of the vertical channel structures VS may include an epitaxial pattern SEG, which is provided to fill a lower portion of each of the vertical channel holes CH. The epitaxial pattern SEG may be in contact with the second substrate 200. The epitaxial pattern SEG may be provided to penetrate at least a portion of the second substrate 200. The ferroelectric pattern FP may conformally cover an inner side surface of each of the vertical channel holes CH and a top surface of the epitaxial pattern SEG. The charge trap pattern CTP may conformally cover an inner side surface of the ferroelectric pattern FP. The vertical semiconductor pattern VSP may cover an inner side surface of the charge trap pattern CTP and may be in contact with the top surface of the epitaxial pattern SEG.

The common source contact CSC may be provided in each of the trenches TR to penetrate the third insulating layer 230 and the stack structure ST, and to extend in the first direction D1. The common source contact CSC may be in contact with the common source region CSR in the second substrate 200. The common source contact CSC may be surrounded by a common source contact spacer CSS. In other words, the common source contact CSC may be electrically disconnected from the first and second gate electrodes ELa and ELb by the common source contact spacer CSS.

Figure 8:
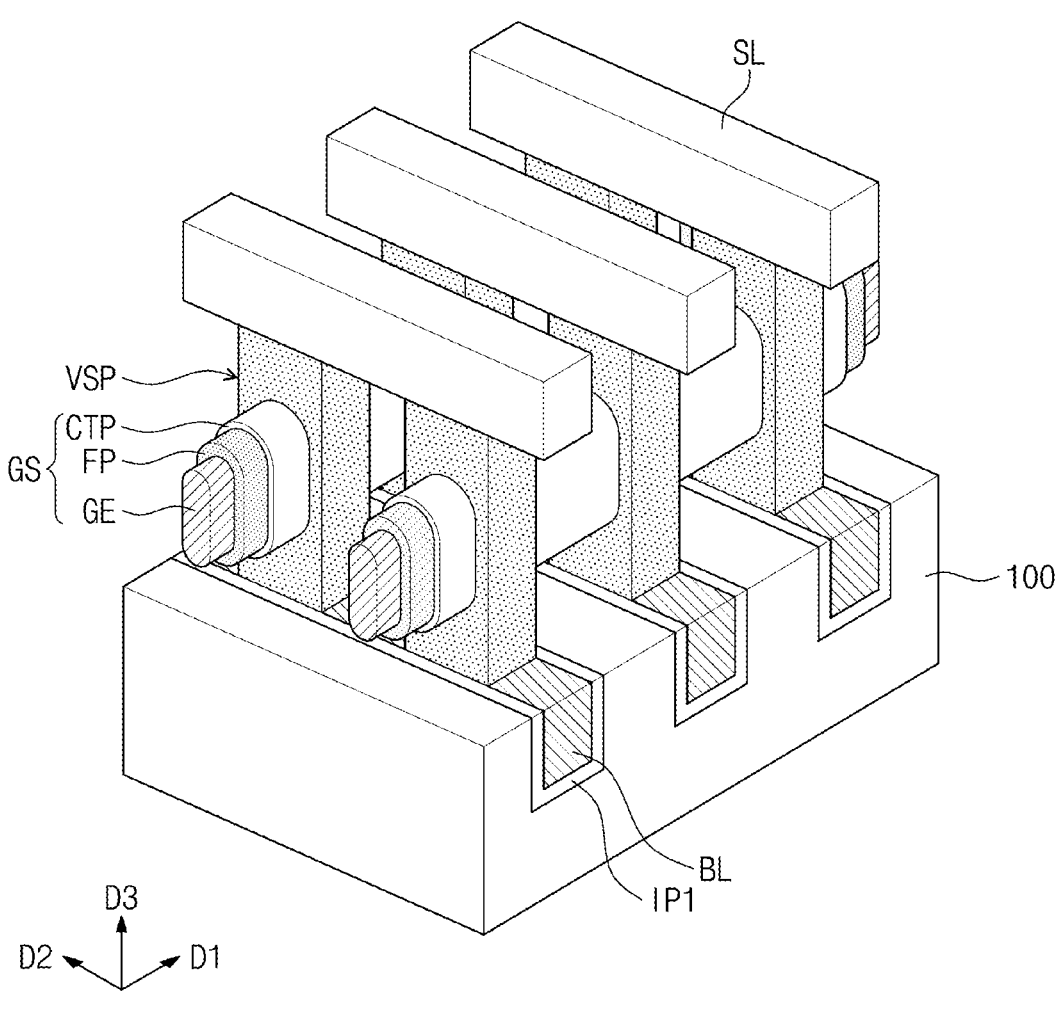
FIG. 8 is a perspective view illustrating a semiconductor memory device according to an example embodiment.
Figure 9A:
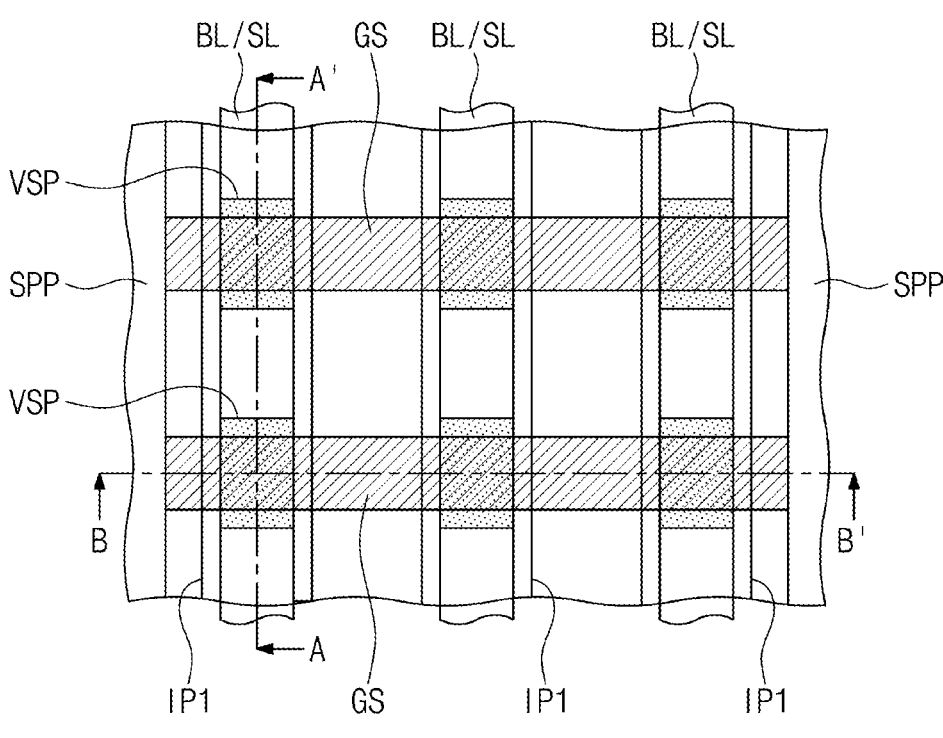
FIG. 9A is a plan view illustrating a semiconductor memory device according to an example embodiment.
Figure 9A:
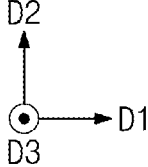
Figure 9B:
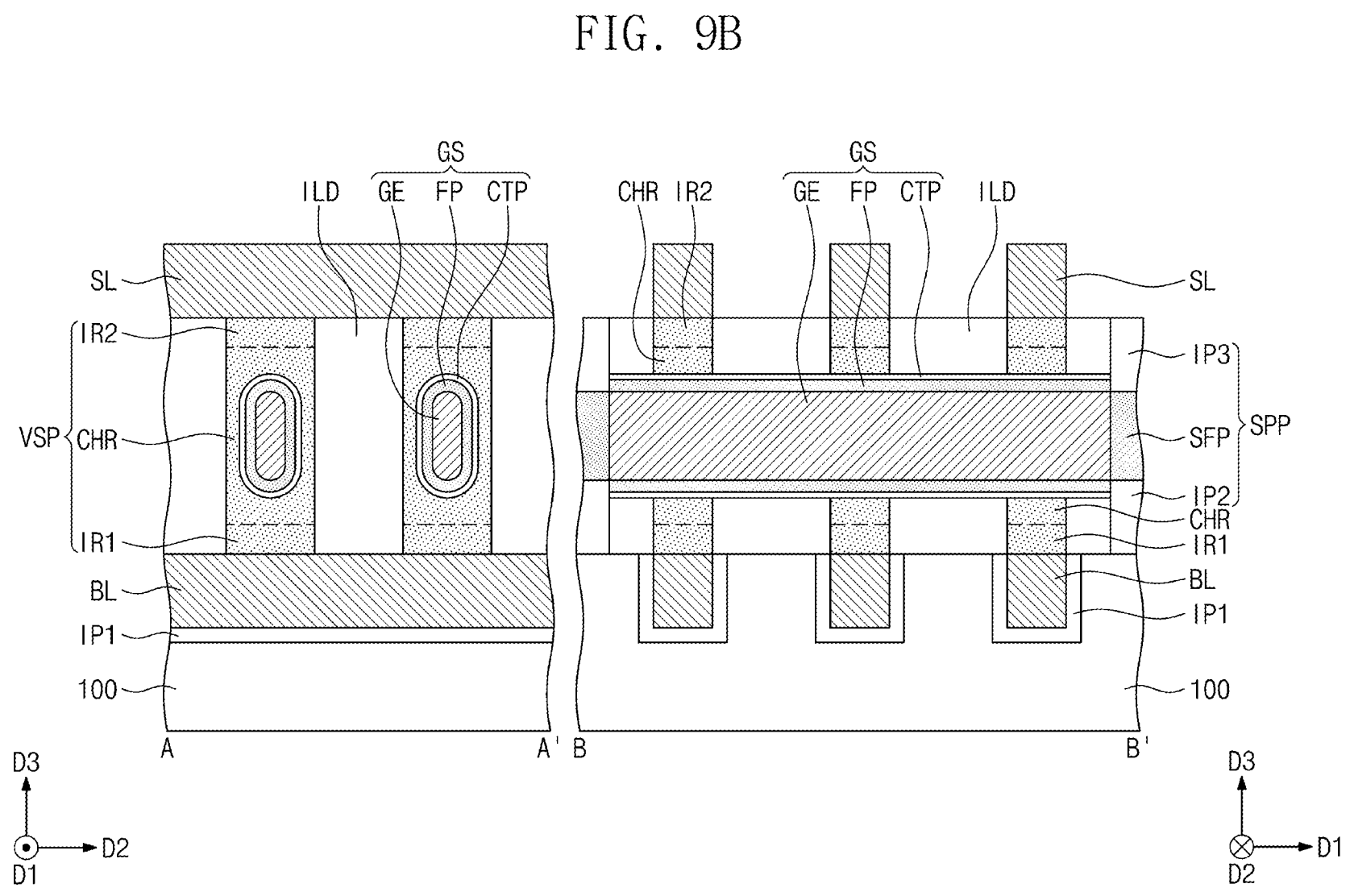

FIG. 8 is a perspective view illustrating a semiconductor memory device according to an example embodiment. FIG. 9A is a plan view illustrating a semiconductor memory device according to an example embodiment. FIG. 9B is a sectional view, which is taken along lines A-A' and B-B' of FIG. 9A to illustrate a semiconductor memory device according to an example embodiment.

Referring to FIGS. 8, 9A, and 9B, a plurality of bit lines BL may be provided on a substrate 100. A top surface of the substrate 100 may be perpendicular to a third direction D3, which is not parallel to a first direction D1 and a second direction D2. The substrate 100 may be a semiconductor substrate containing a semiconductor material. For example, the substrate 100 may be a silicon wafer, a silicon germanium wafer, or a germanium wafer.

The bit lines BL may be arranged apart in the first direction D1, and each of the bit lines BL may be extended in the second direction D2 crossing the first direction D1. In an example embodiment, the bit lines BL may be buried in the substrate 100. The bit lines BL may be formed of or include at least one of conductive materials (e.g., metallic materials).

A first insulating pattern IP1 may be interposed between each of the bit lines BL and the substrate 100. For example, the first insulating pattern IP1 may be interposed between a bottom surface of each of the bit lines BL and the substrate 100 and may be extended into regions between side surfaces of each of the bit lines BL and the substrate 100. Each of the bit lines BL may be spaced apart from the substrate 100 with the first insulating pattern IP1 interposed therebetween. The first insulating pattern IP1 may be formed of or include, e.g., silicon oxide.

A plurality of vertical semiconductor patterns VSP may be provided on the bit lines BL. The vertical semiconductor patterns VSP may be two-dimensionally arranged in the first and second directions D1 and D2 and may be spaced apart from each other in the first and second directions D1 and D2. Each of the vertical semiconductor patterns VSP may be extended in the third direction D3. Ones of the vertical semiconductor patterns VSP, which are spaced apart from each other in the second direction D2, may be connected in common to a corresponding one of the bit lines BL. Ones of the vertical semiconductor patterns VSP, which are spaced apart from each other in the first direction D1, may be respectively connected to different ones of the bit lines BL. The vertical semiconductor patterns VSP may be formed of or include, e.g., polysilicon.

Each of the vertical semiconductor patterns VSP may include a first impurity region IR1, which is provided adjacent to each of the bit lines BL, a second impurity region IR2, which is provided adjacent to each of source lines SL to be described below, and a channel region CHR, which is provided between the first and second impurity regions IR1 and IR2. The first and second impurity regions IR1 and IR2 may have different conductivity types from each other. More specifically, the first impurity region IR1 may have a second conductivity type (e.g., p-type), and the second impurity region IR2 may have a first conductivity type (e.g., n-type) different from the second conductivity type. Due to this difference in conductivity type between the first and second impurity regions IR1 and IR2, it may be possible to reduce time required for an erase operation in the semiconductor memory device.

A plurality of gate structures GS may be provided on the substrate 100. The gate structures GS may be spaced apart from the top surface of the substrate 100 in the third direction D3. Each of the gate structures GS may be provided to penetrate the vertical semiconductor patterns VSP, which are spaced apart from each other in the first direction D1. The gate structures GS may be extended in the first direction D1 to cross the bit lines BL and the source lines SL, when viewed in the plan view of FIG. 9A.

Each of the vertical semiconductor patterns VSP may be provided to enclose an outer surface of a corresponding one of the gate structures GS. More specifically, the channel region CHR of each of the vertical semiconductor patterns VSP may enclose the outer surface of the corresponding one of the gate structures GS. In an example embodiment, each of the gate structures GS may have a shape of a circular or elliptical pillar. For example, when viewed in the section view of FIG. 9B, an outer surface of each of the gate structures GS may have a rounded shape.

Each of the gate structures GS may include a gate electrode GE, which is provided to penetrate the vertical semiconductor patterns VSP and to extend in the first direction D1, a ferroelectric pattern FP, which is provided to conformally surround the gate electrode GE, and a charge trap pattern CTP, which is provided to conformally surround the ferroelectric pattern FP. The ferroelectric pattern FP may be provided between the gate electrode GE and the charge trap pattern CTP, and the charge trap pattern CTP may be provided between the ferroelectric pattern FP and each of the vertical semiconductor patterns VSP. The charge trap pattern CTP may be in direct contact with the channel region CHR of each of the vertical semiconductor patterns VSP. In an example embodiment, both of the ferroelectric pattern FP and the charge trap pattern CTP may be provided in the form of a ring shape having rounded outer surfaces.

The ferroelectric pattern FP may include a ferroelectric material. For example, the ferroelectric pattern FP may be formed of or include at least one of hafnium compounds (HfSiO$_x$, HfO$_2$, HfZnO, and so forth). The charge trap pattern CTP may be formed of or include at least one of, e.g., silicon nitride or zirconium silicate. Since the ferroelectric pattern FP and the charge trap pattern CTP are provided between the gate electrode GE and each of the vertical semiconductor patterns VSP, a semiconductor memory device according to an example embodiment may have not only a non-volatile memory property but also three or more data states.

Supporting patterns SPP may be provided on the substrate 100 to support the gate structures GS. The supporting patterns SPP may be spaced apart from each other in the first direction D1 with the gate structures GS interposed therebetween. Each of the supporting patterns SPP may be extended in the second direction D2. One of the supporting patterns SPP may be in contact with end portions of the gate structures GS, and another one of the supporting patterns SPP may be in contact with other end portions of the gate structures GS, which are opposite to the end portions.

Each of the supporting patterns SPP may include a second insulating pattern IP2, a sacrificial pattern SFP, and a third insulating pattern IP3, which are sequentially stacked on the substrate 100. The sacrificial pattern SFP may include a material having an etch selectivity with respect to the second and third insulating patterns IP2 and IP3. For example, the sacrificial pattern SFP may be formed of or include silicon nitride, and the second and third insulating patterns IP2 and IP3 may be formed of or include silicon oxide.

An interlayer dielectric layer ILD may be provided on the substrate 100 to cover the bit lines BL, the vertical semiconductor patterns VSP, and the gate structures GS. The interlayer dielectric layer ILD may fill spaces between the substrate 100 and the gate structures GS and between the vertical semiconductor patterns VSP. A top surface of the interlayer dielectric layer ILD may be substantially coplanar with the top surfaces of the vertical semiconductor patterns VSP, and thus, the top surfaces of the vertical semiconductor patterns VSP may be exposed to the outside of the interlayer dielectric layer ILD. The interlayer dielectric layer ILD may be formed of or include at least one of silicon oxide, silicon nitride, silicon oxynitride, and/or low-k dielectric materials.

The source lines SL may be provided on the interlayer dielectric layer ILD and the vertical semiconductor patterns VSP. The source lines SL may be spaced apart from each other in the first direction D1. The source lines SL may be extended in the second direction D2 to cross the gate structures GS, when viewed in the plan view of FIG. 9A. Each of the source lines SL may be connected to the second impurity regions IR2 of the vertical semiconductor patterns VSP. The source lines SL may be formed of or include at least one of conductive materials (e.g., metallic materials).

Ones of the vertical semiconductor patterns VSP, which are spaced apart from each other in the second direction D2, may be connected in common to a corresponding one of the source lines SL. Ones of the vertical semiconductor patterns VSP, which are spaced apart from each other in the first direction D1, may be connected to respective ones of the source lines SL.

Figure 10:
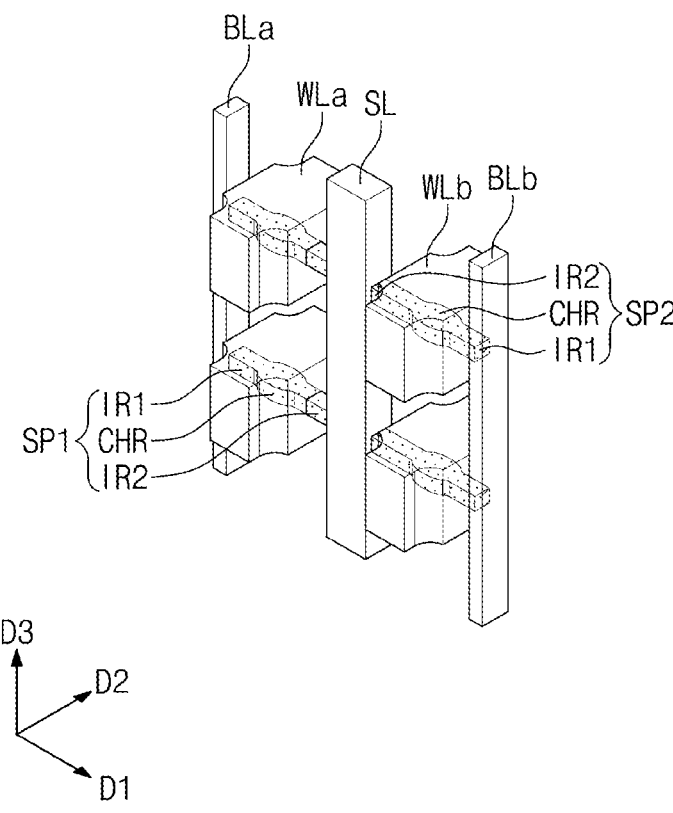
FIG. 10 is a perspective view illustrating a semiconductor memory device according to an example embodiment.
Figure 11A:
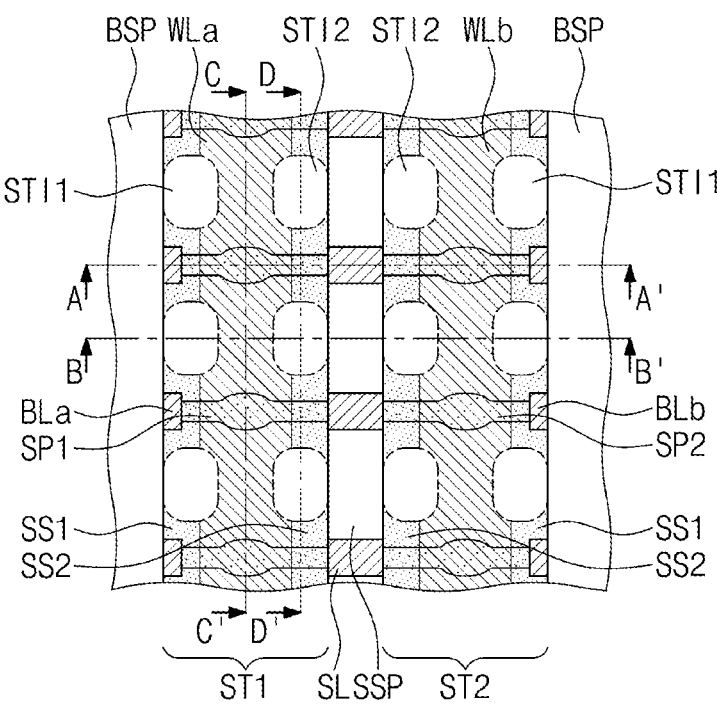
FIG. 11A is a plan view illustrating a semiconductor memory device according to an example embodiment.
Figure 11A:
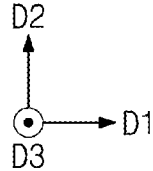
Figure 11B:
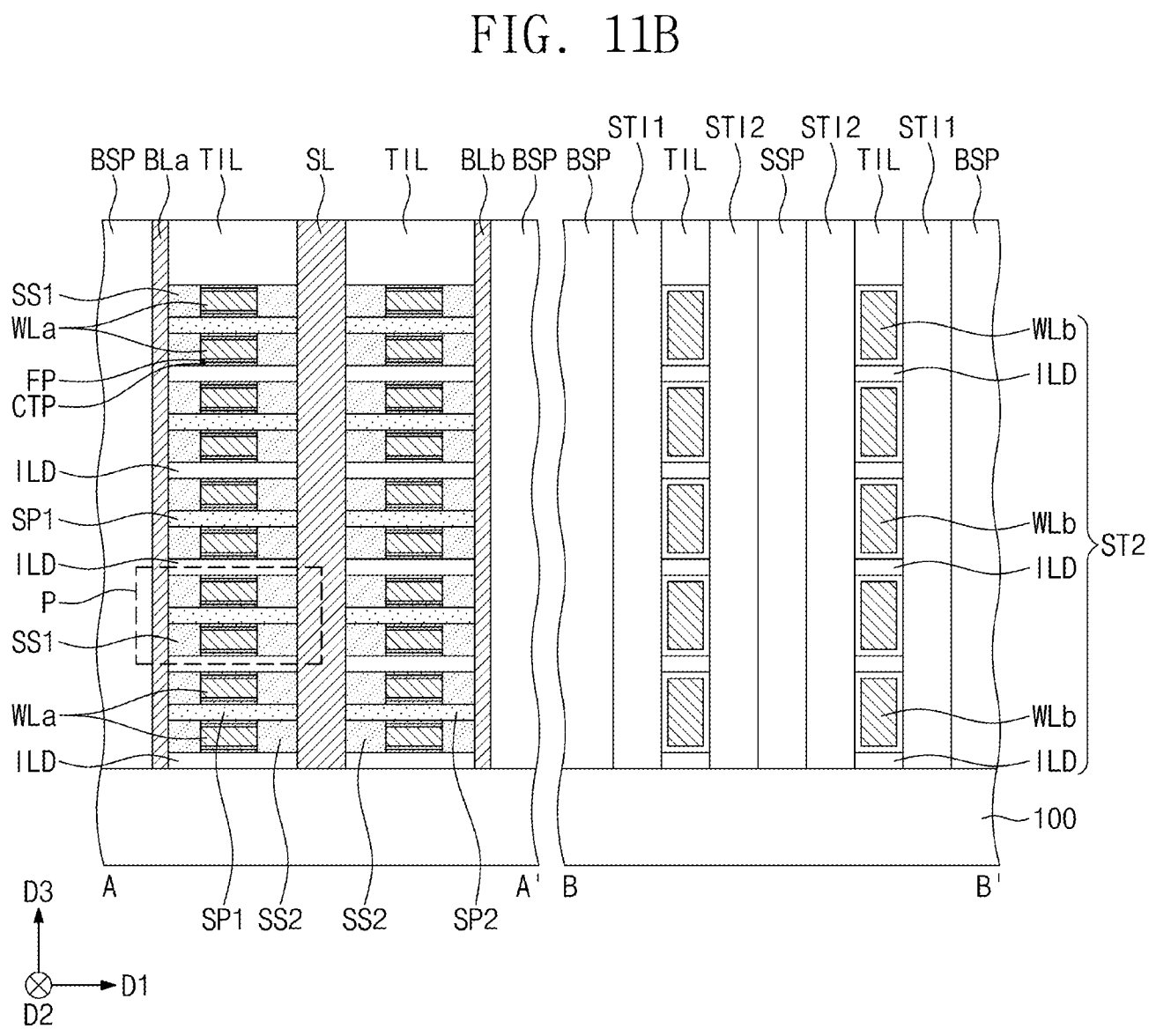
Figure 11C:
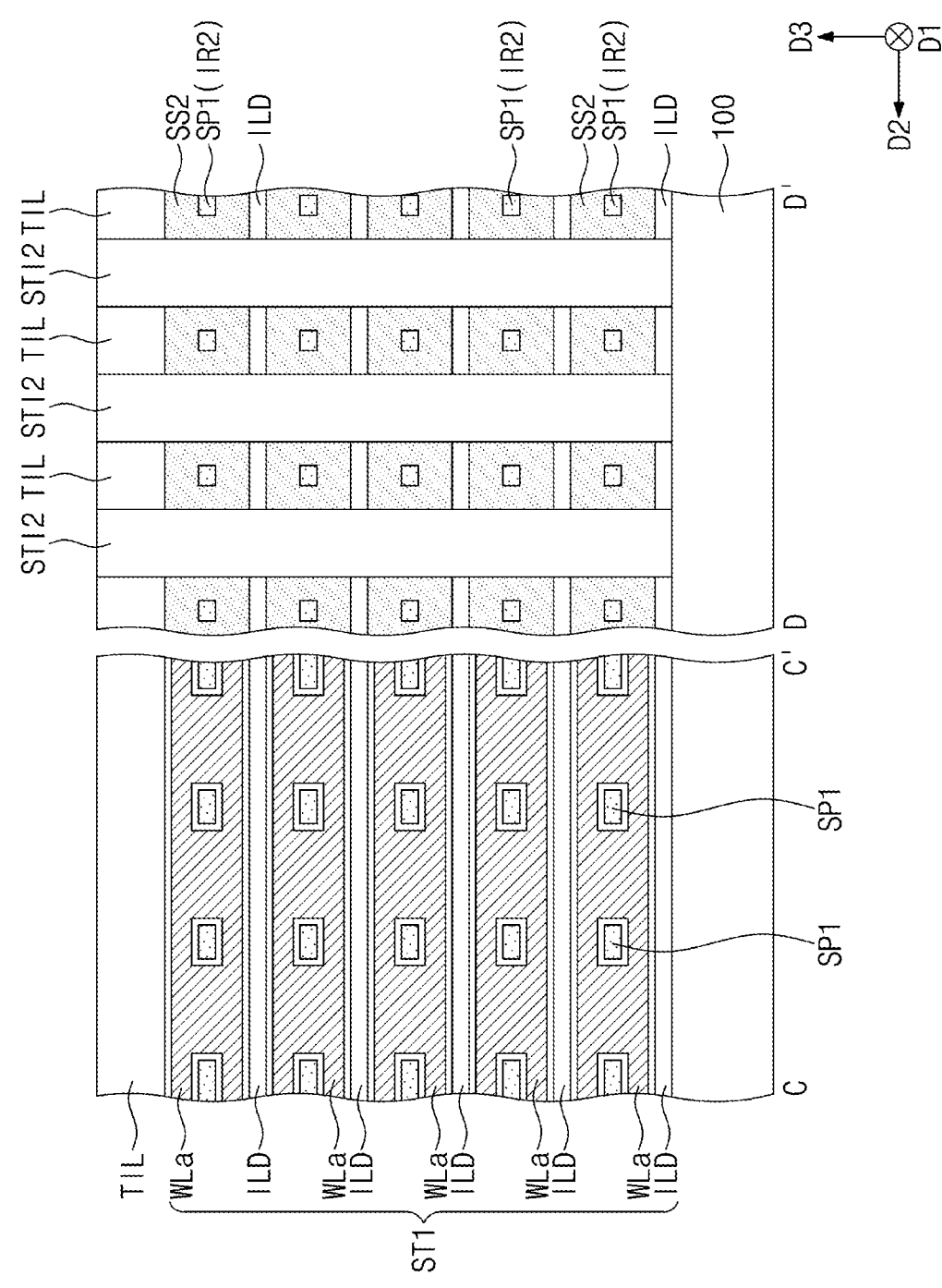
FIG. 11C is a sectional view, which is taken along lines C-C' and D-D' of FIG. 11A to illustrate a semiconductor memory device according to an example embodiment.
Figure 12:
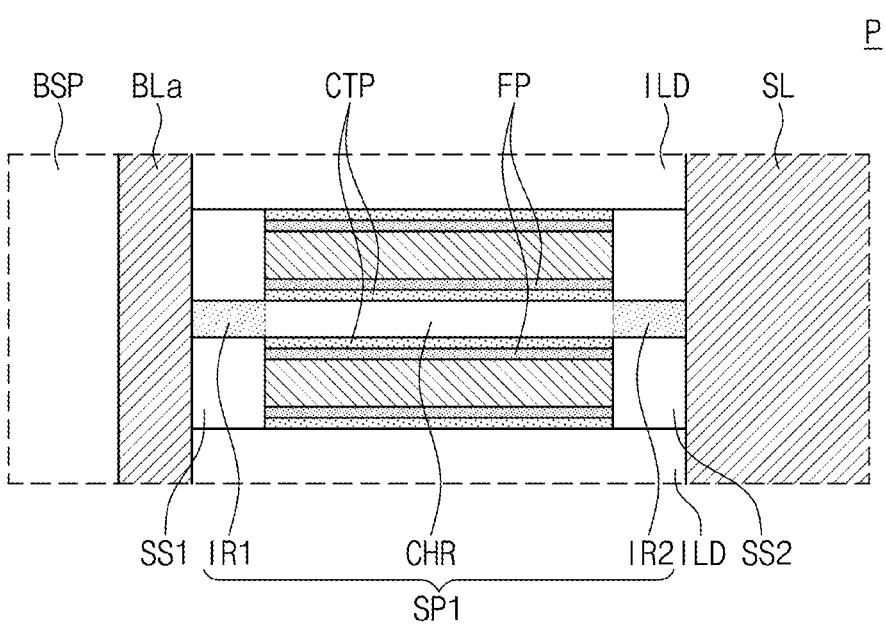
FIG. 12 is an enlarged section view illustrating a portion (e.g., 'P' of FIG. 11B) of a semiconductor memory device according to an example embodiment.

FIG. 10 is a perspective view illustrating a semiconductor memory device according to an example embodiment. FIG. 11A is a plan view illustrating a semiconductor memory device according to an example embodiment. FIG. 11B is a sectional view, which is taken along lines A-A' and B-B' of FIG. 11A to illustrate a semiconductor memory device according to an example embodiment. FIG. 11C is a sectional view, which is taken along lines C-C' and D-D' of FIG. 11A to illustrate a semiconductor memory device according to an example embodiment. FIG. 12 is an enlarged section view illustrating a portion (e.g., 'P' of FIG. 11B) of a semiconductor memory device according to an example embodiment.

Referring to FIGS. 10, 11A, 111B, and 12, first and second stack structures ST1 and ST2 may be provided on a substrate 100. A top surface of the substrate 100 may be perpendicular to a third direction D3, which is not parallel to a first direction D1 and a second direction D2. The substrate 100 may be a semiconductor substrate that is formed of or includes a semiconductor material. For example, the substrate 100 may be a silicon wafer, a silicon germanium wafer, or a germanium wafer.

The first and second stack structures ST1 and ST2 may be arranged in the first direction D1. Each of the first and second stack structures ST1 and ST2 may be extended in the second direction D2 crossing the first direction D1.

The first stack structure ST1 may include interlayer dielectric layers ILD and first word lines WLa, which are alternately and repeatedly stacked in the third direction D3. The second stack structure ST2 may include the interlayer dielectric layers ILD and second word lines WLb, which are alternately and repeatedly stacked in the third direction D3. Each of the first and second stack structures ST1 and ST2 may further include an upper insulating layer TIL, which is provided to cover the uppermost one of the first word lines WLa and the uppermost one of the second word lines WLb.

Each of the first and second word lines WLa and WLb may include first portions having a first width and second portions having a second width larger than the first width, and here, the first and second widths may be values measured in the first direction D1. Each of the first portions may be provided between first and second separation insulating patterns STI1 and STI2, which are adjacent to each other.

The first and second word lines WLa and WLb may be formed of or include at least one of, e.g., doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

First semiconductor patterns SP1 may be provided on the substrate 100 to be spaced apart from each other in the second direction D2 and the third direction D3. The first semiconductor patterns SP1 may be extended in the first direction D1 to cross the first word lines WLa. Each of the first word lines WLa may be extended in the second direction D2 to enclose ones of the first semiconductor patterns SP1 located at the same level. Each of the first semiconductor patterns SP1 may penetrate a corresponding one of the second portions of the first word lines WLa in the first direction D1. That is, each of the first word lines WLa may have a structure (i.e., a gate-all-around structure) completely surrounding a channel region CHR of each of the first semiconductor patterns SP1.

Second semiconductor patterns SP2 may be provided on the substrate 100 to be spaced apart from each other in the second direction D2 and the third direction D3. Each of the second semiconductor patterns SP2 may be spaced apart from ones of the first semiconductor patterns SP1, which are located at the same level, in the first direction D1. The second semiconductor patterns SP2 may be extended in the first direction D1 to cross the second word lines WLb. Each of the second word lines WLb may be extended in the second direction D2 to enclose ones of the second semiconductor patterns SP2 located at the same level. Each of the second semiconductor patterns SP2 may penetrate a corresponding one of the second portions of the second word lines WLb in the first direction D1. In other words, each of the second word lines WLb may have a structure (i.e., a gate-all-around structure) completely surrounding the channel region CHR of each of the second semiconductor patterns SP2.

Each of the first and second semiconductor patterns SP1 and SP2 may include a first impurity region IR1, which is provided adjacent to each of first and second bit lines BLa and BLb to be described below, a second impurity region IR2, which is provided adjacent to each of source lines SL to be described below, and the channel region CHR, which is provided between the first and second impurity regions IR1 and IR2. The first and second impurity regions IR1 and IR2 may have different conductivity types from each other. More specifically, the first impurity region IR1 may have a second conductivity type (e.g., p-type), and the second impurity region IR2 may have a first conductivity type (e.g., n-type) different from the second conductivity type. Due to this difference in conductivity type between the first and second impurity regions IR1 and IR2, it may be possible to reduce time required for an erase operation in the semiconductor memory device.

The first and second semiconductor patterns SP1 and SP2 may be arranged to have symmetry about each other, with the source lines SL interposed therebetween. The second impurity regions IR2 of the first and second semiconductor patterns SP1 and SP2, which are adjacent to each other in the first direction D1, may be connected in common to a corresponding one of the source lines SL. The first and second semiconductor patterns SP1 and SP2 may be formed of or include, e.g., polysilicon.

The first separation insulating patterns STI1 may be provided between the first impurity regions IR1 of the first semiconductor patterns SP1, which are adjacent to each other in the second direction D2, and between the first impurity regions IR1 of the second semiconductor patterns SP2, which are adjacent to each other in the second direction D2.

The second separation insulating patterns STI2 may be provided between the second impurity regions IR2 of the first semiconductor patterns SP1, which are adjacent to each other in the second direction D2, and between the second impurity regions IR2 of the second semiconductor patterns SP2, which are adjacent to each other in the second direction D2.

The first and second separation insulating patterns STI1 and STI2 may be extended from the top surface of the substrate 100 in the third direction D3. The first portions of each of the first and second word lines WLa and WLb may be provided between the first and second separation insulating patterns STI1 and STI2, which are adjacent to each other. The first and second separation insulating patterns STI1 and STI2 may be formed of or include at least one of, e.g., silicon oxide or silicon oxynitride.

Referring to FIG. 12, a ferroelectric pattern FP and a charge trap pattern CTP may be provided between the channel region CHR of each of the first and second semiconductor patterns SP1 and SP2 and the first and second word lines WLa and WLb and between the interlayer dielectric layers ILD and the first and second word lines WLa and WLb. The ferroelectric pattern FP may be provided between the charge trap pattern CTP and the first and second word lines WLa and WLb. The charge trap pattern CTP may be provided between the ferroelectric pattern FP and the channel region CHR of each of the first and second semiconductor patterns SP1 and SP2. The charge trap pattern CTP may be in direct contact with the channel region CHR of each of the first and second semiconductor patterns SP1 and SP2.

The ferroelectric pattern FP may include a ferroelectric material. For example, the ferroelectric pattern FP may be formed of or include at least one of hafnium compounds ($HfSiO_x$, $HfO_2$, $HfZnO$, and so forth). The charge trap pattern CTP may be formed of or include at least one of, e.g., silicon nitride or zirconium silicate. Since the ferroelectric pattern FP and the charge trap pattern CTP are provided between the channel region CHR of each of the first and second semiconductor patterns SP1 and SP2 and the first and second word lines WLa and WLb, a semiconductor memory device according to an example embodiment may have not only a non-volatile memory property but also three or more data states.

In each of the first and second stack structures ST1 and ST2, first and second spacer insulating patterns SS1 and SS2 may be provided between ones of the interlayer dielectric layers ILD, which are vertically adjacent to each other. Each of the first spacer insulating patterns SS1 may be provided to enclose the first impurity region IR1 of each of the first and second semiconductor patterns SP1 and SP2. Each of the second spacer insulating patterns SS2 may be provided to enclose the second impurity region IR2 of each of the first and second semiconductor patterns SP1 and SP2. The first and second spacer insulating patterns SS1 and SS2 may be formed of or include at least one of, e.g., silicon oxide or silicon oxynitride.

The first and second bit lines BLa and BLb may be provided to be extended from the top surface of the substrate 100 in the third direction D3. The first and second bit lines BLa and BLb may be provided to cross the first and second word lines WLa and WLb.

The first bit lines BLa may be spaced apart from each other in the second direction D2 with one of the first separation insulating patterns STI1 interposed therebetween. Each of the first bit lines BLa may be in contact with side surfaces of the first semiconductor patterns SP1, which are spaced apart from each other in the third direction D3. In other words, each of the first bit lines BLa may be connected to the first impurity regions IR1 of the first semiconductor patterns SP1.

The second bit lines BLb may be spaced apart from the first bit lines BLa in the first direction D1. The second bit lines BLb may be spaced apart from each other in the second direction D2 with one of the first separation insulating patterns STI1 interposed therebetween. Each of the second bit lines BLb may be in contact with side surfaces of the second semiconductor patterns SP2, which are spaced apart from each other in the third direction D3. In other words, each of the second bit lines BLb may be connected to the first impurity regions IR1 of the second semiconductor patterns SP2.

The source lines SL may be provided between the first and second semiconductor patterns SP1 and SP2, which are adjacent to each other in the first direction D1. The source lines SL may be extended from the top surface of the substrate 100 in the third direction D3. The source lines SL may be spaced apart from each other in the first direction D1. The source lines SL may be provided to cross the first and second word lines WLa and WLb.

In an example embodiment, a single source line SL extended in the second direction D2 may be provided to be connected in common to the first semiconductor patterns SP1, which are arranged in the second and third directions D2 and D3, and the second semiconductor patterns SP2, which are arranged in the second and third directions D2 and D3.

Furthermore, in an example embodiment, the source lines SL may include a plurality of first source lines, which are spaced apart from each other in the second direction D2 and are connected to the first semiconductor patterns SP1 arranged in the third direction D3, and a plurality of second source lines, which are spaced apart from each other in the second direction D2, are spaced apart from the first source lines in the first direction D1, and are connected to the second semiconductor patterns SP2 arranged in the third direction D3.

Bit line separation insulating patterns BSP may be provided to extend from the top surface of the substrate 100 in the third direction D3 and to cover side surfaces of the first and second bit lines BLa and BLb. Each of the bit line separation insulating patterns BSP may be extended in the first direction D1. Source line separation insulating patterns SSP may be provided between the source lines SL, which are adjacent to each other in the first direction D1, and may be extended from the top surface of the substrate 100 in the third direction D3. The source line separation insulating patterns SSP may be provided between the second separation insulating patterns STI2 adjacent to each other in the second direction D2. The bit line separation insulating patterns BSP and the source line separation insulating patterns SSP may be formed of or include at least one of, e.g., silicon oxide or silicon oxynitride.

As described above, embodiments relate to a semiconductor memory device, in which a ferroelectric pattern and a charge trap pattern are provided between a gate electrode and a channel region, and a source region and a drain region have different conductivity types from each other.

Embodiments may provide a semiconductor memory device with improved electrical characteristics and reliability.

According to an example embodiment, a ferroelectric pattern and a charge trap pattern may be provided between a gate electrode and a channel region, and in this case, a semiconductor memory device may have not only a non-volatile memory property but also three or more data states.

According to an example embodiment, a source region and a drain region may be provided to have different conductivity types from each other, and in this case, it may be possible to reduce an operation time required for an erase operation in the semiconductor memory device.

Accordingly, it may be possible to improve electrical characteristics and reliability of a semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate;
a stack structure including interlayer dielectric layers and gate electrodes, which are alternately and repeatedly stacked on the substrate; and
vertical channel structures, which are provided in vertical channel holes penetrating the stack structure and are in contact with the substrate, wherein:
each of the vertical channel structures includes:
a ferroelectric pattern formed of a ferroelectric material, the ferroelectric pattern covering an inner side surface of a corresponding vertical channel hole of the vertical channel holes;
a vertical semiconductor pattern, which covers the ferroelectric pattern and is connected to the substrate;
a charge trap pattern interposed between the ferroelectric pattern and the vertical semiconductor pattern; and
a conductive pad provided on the vertical semiconductor pattern,
the substrate and the conductive pad have different conductivity types from each other,
the ferroelectric pattern and the charge trap pattern vertically extend between the substrate and the conductive pad, and
an inner side surface of the charge trap pattern is in direct contact with an outer side surface of the vertical semiconductor pattern.

2. The semiconductor memory device as claimed in claim 1, further comprising a source structure between the substrate and the stack structure, wherein:

the source structure has a conductivity type different from the conductive pad, and
the source structure is in contact with the vertical semiconductor pattern.

3. The semiconductor memory device as claimed in claim 1, wherein:
the stack structure includes a plurality of stack structures,
the semiconductor memory device further comprises separation structures provided in trenches, which extend between adjacent stack structures of the plurality of stack structures, and
the separation structures are spaced apart from the vertical channel structures in a horizontal direction.

4. The semiconductor memory device as claimed in claim 1, wherein:
the stack structure includes a plurality of stack structures,
the semiconductor memory device further comprises:
a common source region provided in the substrate;
a common source contact provided in each trench of a plurality of trenches, which extend between adjacent stack structures of the plurality of stack structures; and
a common source contact spacer enclosing the common source contact, and
the common source region has a conductivity type different from that of the conductive pad.

5. The semiconductor memory device as claimed in claim 4, wherein:
each of the vertical channel structures further includes an epitaxial pattern filling a lower portion of the corresponding vertical channel hole of the vertical channel holes, and
the vertical semiconductor pattern of each of the vertical channel structures is in contact with a corresponding epitaxial pattern.

6. The semiconductor memory device as claimed in claim 1, wherein:
the substrate includes a cell array region, and a contact region extending from the cell array region,
the stack structure has a staircase structure on the contact region, and
as a distance from the substrate increases, a length of the gate electrodes of the stack structure decreases.

7. The semiconductor memory device as claimed in claim 1, wherein:
each of the vertical channel holes includes a lower vertical channel hole and an upper vertical channel hole, which are vertically connected to each other,
each of the vertical channel structures includes a lower vertical channel structure filling a corresponding lower vertical channel hole, and an upper vertical channel structure filling a corresponding upper vertical channel hole, and
an uppermost width of the lower vertical channel structure is larger than a lowermost width of the upper vertical channel structure.

8. The semiconductor memory device as claimed in claim 1, wherein:
the vertical semiconductor pattern includes polysilicon,
the ferroelectric pattern includes hafnium compound, and
the charge trap pattern includes silicon nitride or zirconium silicate.

9. The semiconductor memory device as claimed in claim 1, further comprising a peripheral circuit structure that is vertically below the substrate such that the substrate is vertically between the stack structure and the peripheral circuit structure.

\* \* \* \* \*